（12）United States Patent
Seshimo et al.

(10) Patent No.: US 11,462,870 B2
(45) Date of Patent: Oct. 4, 2022

(54) WIRING BOARD AND ELECTRONIC COMPONENT TESTING APPARATUS COMPRISING COAXIAL CONNECTOR, AND COAXIAL CONNECTOR

(71) Applicants: ADVANTEST Corporation, Tokyo (JP); Molex, LLC, Lisle, IL (US)

(72) Inventors: Takahito Seshimo, Tokyo (JP); Atsunori Shibuya, Tokyo (JP); Masayuki Arai, Kanagawa (JP); Masataka Oyama, Kanagawa (JP); Shigeru Akiyama, Kanagawa (JP); Ayako Matsumoto, Kanagawa (JP)

(73) Assignees: ADVANTEST Corporation, Tokyo (JP); Molex, LLC, Lisle, IL (US)

( * ) Notice: Subject to any disclaimer, the term of this patent is extended or adjusted under 35 U.S.C. 154(b) by 79 days.

(21) Appl. No.: 17/201,593

(22) Filed: Mar. 15, 2021

(65) Prior Publication Data

US 2021/0376544 A1    Dec. 2, 2021

(30) Foreign Application Priority Data

May 26, 2020   (JP) .............................. JP2020-091498

(51) Int. Cl.
*H01R 24/78*        (2011.01)
*H01R 13/11*        (2006.01)
(Continued)

(52) U.S. Cl.
CPC ......... *H01R 24/78* (2013.01); *G01R 31/2889* (2013.01); *H01R 12/7064* (2013.01);
(Continued)

(58) Field of Classification Search
CPC .... H01R 2103/00; H01R 24/50; H01R 24/78; H01R 13/112; H01R 12/7064; H01R 12/714; H01R 2201/20; G01R 31/2889
(Continued)

(56) References Cited

U.S. PATENT DOCUMENTS 8,657,625 B2 *  2/2014  Wagata ................ H01R 13/422
                                                        439/581
8,690,583 B2 *  4/2014  Uesaka ................ H01R 12/714
                                                        439/63
(Continued)

FOREIGN PATENT DOCUMENTS

JP    2011-238495 A    11/2011
JP    2013-026145 A     2/2013

*Primary Examiner* — Gary F Paumen
(74) *Attorney, Agent, or Firm* — Osha Bergman Watanabe & Burton LLP

(57) ABSTRACT

A wiring board includes a wiring board body and a coaxial connector. The coaxial connector includes coaxial terminals and a housing. The coaxial terminals are arranged in row. Each of the coaxial terminals includes a signal terminal and a ground terminal. The ground terminal includes a tubular main body and first and second contact pieces that respectively extend from the main body and respectively include first and second contact portions in contact with the wiring board body, in a transparent plan view seen through the wiring board along a normal direction of the wiring board body. A part of the first contact piece of a first coaxial terminal overlaps with a part of the second contact piece of a second coaxial terminal adjacent to the first coaxial terminal.

14 Claims, 19 Drawing Sheets

(51) Int. Cl.
  *H01R 12/70* (2011.01)
  *G01R 31/28* (2006.01)
  *H01R 12/71* (2011.01)
  *H01R 103/00* (2006.01)

(52) U.S. Cl.
  CPC ......... *H01R 12/714* (2013.01); *H01R 13/112* (2013.01); *H01R 2103/00* (2013.01); *H01R 2201/20* (2013.01)

(58) Field of Classification Search
  USPC .................................................. 439/581, 63
  See application file for complete search history.

(56) References Cited

U.S. PATENT DOCUMENTS

2011/0279140 A1    11/2011  Uesaka et al.
2013/0189866 A1     7/2013  Wagata et al.
2021/0376529 A1*  12/2021  Seshimo ............ H01R 13/6471

* cited by examiner

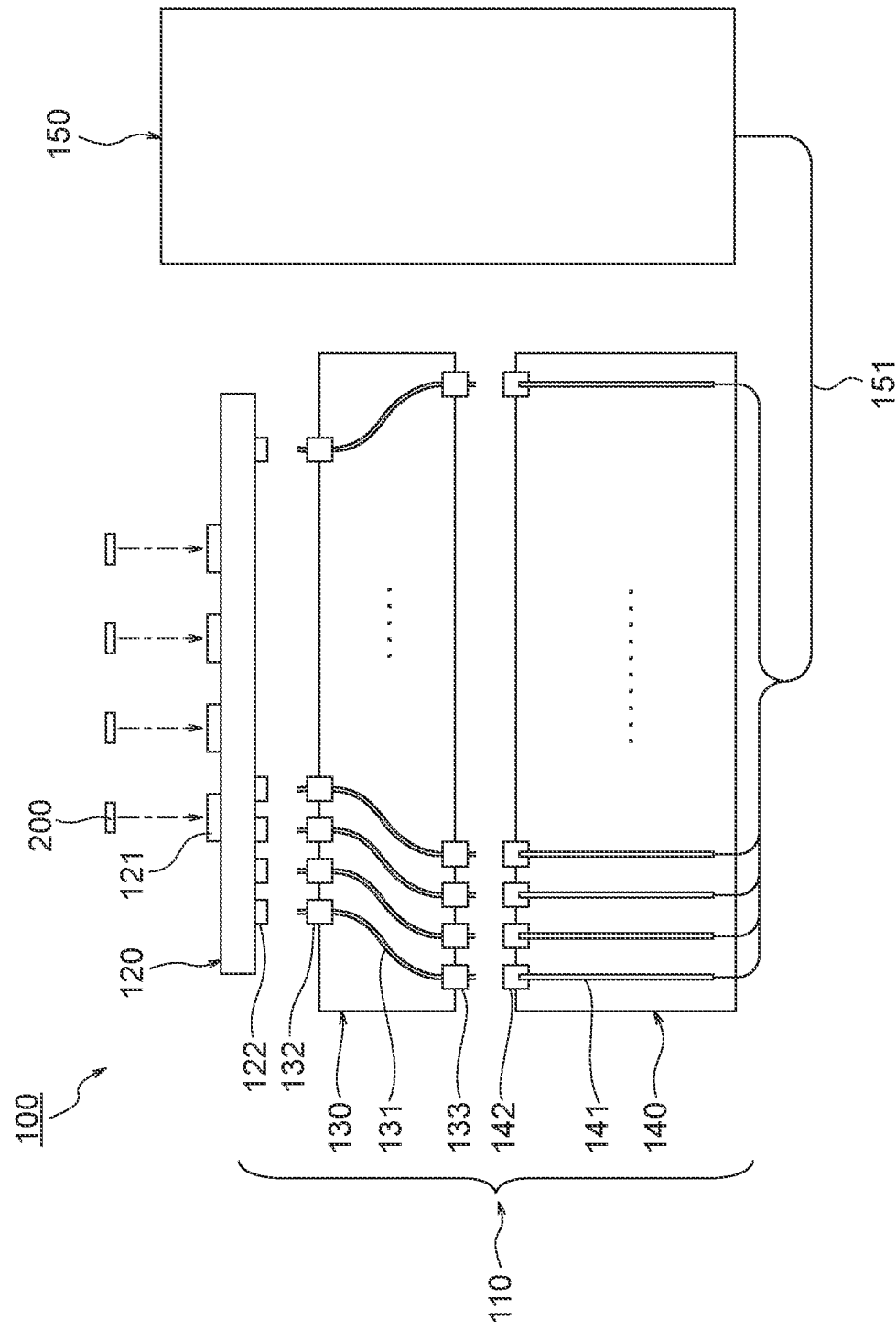

WIRING BOARD AND ELECTRONIC COMPONENT TESTING APPARATUS COMPRISING COAXIAL CONNECTOR, AND COAXIAL CONNECTOR

CROSS-REFERENCE TO RELATED APPLICATIONS

The present application claims priority from Japanese Patent Application No. 2020-091498 filed on May 26, 2020, the contents of which are incorporated herein by reference in their entirety.

BACKGROUND

Technical Field

The present disclosure relates to a wiring board and an electronic component test apparatus including a coaxial connector that can be used in an electronic component testing apparatus that tests an electronic component to be tested (DUT: Device Under Test) such as a semiconductor integrated circuit element, and the coaxial connector.

Description of the Related Art

A conventional coaxial terminal includes a ground terminal that has a tubular body and a signal terminal that is disposed inside the tubular body, and the ground terminal has a plurality of contact portions that contacts the circuit board (e.g., refer to Patent Document 1).

Patent Document

PATENT DOCUMENT 1: JP 2011-238495 A

In the connector using the coaxial terminal described above, it is required to arrange more coaxial terminals in a high density. On the other hand, if the coaxial terminals are arranged in a high density, there is a case where it is impossible to satisfy the desired electrical characteristics.

SUMMARY

One or more embodiments of the present disclosure provide a wiring board and an electronic component testing apparatus that include a coaxial connector capable of arranging the coaxial terminals in a high density and ensuring desired electrical characteristics and provide the coaxial connector.

[1] A wiring board according to one or more embodiments of the present disclosure is a wiring board including a wiring board body, and a coaxial connector that is mounted on the wiring board body, the coaxial connector includes a plurality of coaxial terminals, and a housing that holds the coaxial terminals, the coaxial terminals are arranged so as to form at least one row, the coaxial terminal includes a signal terminal, and a ground terminal that covers the signal terminal at intervals, the ground terminal includes a tubular first main body, and first and second contact pieces that respectively extend from the first main body and respectively includes first and second contact portions that are in contact with the wiring board body, in a transparent plan view that is seen through the wiring board along the normal direction of the wiring board body, a part of the first contact piece of the coaxial terminal overlaps with a part of the second contact piece of the adjacent coaxial terminal.

[2] In the above embodiments, the first contact piece may include the first contact portion that is located outside the first main body in the transparent plan view, a first root portion that is connected to the first main body, and a first bent portion that is interposed between the first contact portion and the first root portion and is located inside the first main body in the transparent plan view, the second contact piece may include the second contact portion that is located inside the first main body in the transparent plan view, a second root portion that is connected to the first main body, and a second bent portion that is interposed between the second contact portion and the second root portion and is located outside the first main body in the transparent plan view, and in the transparent plan view, the first contact portion of the coaxial terminal may overlap with the second bent portion of the adjacent coaxial terminal.

[3] In the above embodiments, the coaxial terminals may be arranged to form a plurality of rows arranged in parallel with each other, the coaxial terminals in mutually adjacent rows may be arranged alternately, the signal terminal may include a second main body, and a third contact piece that extends from the second main body and includes a third contact portion that is in contact with the wiring board body, in the transparent plan view, the first contact portion of the coaxial terminal may be located on a first virtual straight line, and the first virtual straight line may be a virtual straight line that passes through the third contact portion of the coaxial terminal and the third contact portion of the coaxial terminal in an adjacent row.

[4] In the above embodiments, the third contact piece may extend from the second main body to a first direction side in the transparent plan view, and the first direction may be a direction that is substantially parallel to an arrangement direction of the coaxial terminals that are included in the same row and may be a direction from the second contact piece toward the first contact piece in the transparent plan view.

[5] In the above embodiments, the coaxial terminal may include a pair of the second contact pieces, and in the transparent plan view, a part of the pair of the second contact pieces of the ground terminal may respectively overlap with a part of the signal terminal.

[6] In the above embodiments, the coaxial terminals may be arranged to form a plurality of rows arranged in parallel with each other, the coaxial terminals in adjacent rows may be arranged alternately, in the transparent plan view, a part of the signal terminal of the coaxial terminal may be located on a second virtual straight line, and the second virtual straight line may be a virtual straight line that extends in a direction substantially perpendicular to an arrangement direction of the coaxial terminals that are included in the same row and may pass through the second contact of the coaxial terminal in an adjacent row.

[7] In the above embodiments, the coaxial terminals may be arranged to form a plurality of rows arranged in parallel with each other, the coaxial terminals in adjacent rows may be arranged alternately, in the transparent plan view, a part of the signal terminal of the coaxial terminal may be located on a third virtual straight line, and the third virtual straight line may be a virtual straight line that extends in a direction substantially perpendicular to an arrangement direction of the coaxial terminals that are included in the same row and may pass through a part of the signal terminal of the coaxial terminal in an adjacent row.

[8] In the above embodiments, the ground terminal may include a fourth contact piece that extends from the first main body to a side opposite to the first and second contact pieces.

[9] In the above embodiments, the signal terminal may include a second main body, a third contact piece that extends from the second main body and includes a third contact portion that is in contact with the wiring board body, and a fifth contact piece that extends from the second main body to the opposite side of the third contact piece.

[10] In the above embodiments, the coaxial terminal may include a pair of the first contact pieces, and a pair of the second contact pieces, in the transparent plan view, the pair of first contact pieces may be arranged in line symmetry with respect to a centerline of the coaxial terminal that extends along a direction substantially parallel to an arrangement direction of the coaxial terminals that are included in the same row, and in the transparent plan view, the pair of second contact pieces may be arranged in line symmetry with respect to the centerline.

[11] In the above embodiments, the coaxial terminal may include an insulating member (i.e., insulator) that is interposed between the signal terminal and the ground terminal.

[12] In the above embodiments, the wiring board body may include a first wiring pattern that the first and second contact portions of the ground terminal are in contact with, and a second wiring pattern that the third contact portion of the signal terminal is in contact with.

[13] An electronic component testing apparatus according to one or more embodiments of the present disclosure is an electronic component testing apparatus that tests a DUT and is an electronic component testing apparatus includes the wiring board described above.

[14] A coaxial connector according to one or more embodiments of the present disclosure is a coaxial connector including a plurality of coaxial terminals, and a housing that holds the coaxial terminal, the coaxial terminals are arranged so as to form at least one row, the coaxial terminal includes a signal terminal, and a ground terminal that covers the signal terminal at intervals, the ground terminal includes a tubular first main body, and first and second contact pieces that respectively extend from the first main body and respectively include first and second contact portions at tips, and when the wiring board is assembled by mounting the coaxial connector on the wiring board body, a part of the first contact piece of the coaxial terminal overlaps with a part of the second contact piece of the adjacent coaxial terminal, in a transmission plan view that is seen through the wiring board along the normal direction of the wiring board body.

According to one or more embodiments of the present disclosure, since a part of the first contact piece of the coaxial terminal overlaps with a part of the second contact piece of the adjacent coaxial terminal in the transparent plan view, it is possible to narrow the distance between the coaxial terminals that are adjacent to each other and to arrange the coaxial terminals in a high density. Further, according to one or more embodiments of the present disclosure, since the first contact piece and the second contact piece can be densely interposed between the signal terminals adjacent to each other, it is possible to improve the shielding performance of the coaxial terminal. Therefore, according to one or more embodiments of the present disclosure, it is possible to arrange the coaxial terminals in a high density and to ensure desired electrical characteristics.

BRIEF DESCRIPTION OF DRAWINGS

FIG. 19 is a schematic diagram showing a configuration of an electronic component testing apparatus in one or more embodiments of the present disclosure.

DETAILED DESCRIPTION

Hereinafter, embodiments of the present disclosure will be described with reference to the drawings.

Figure 1:
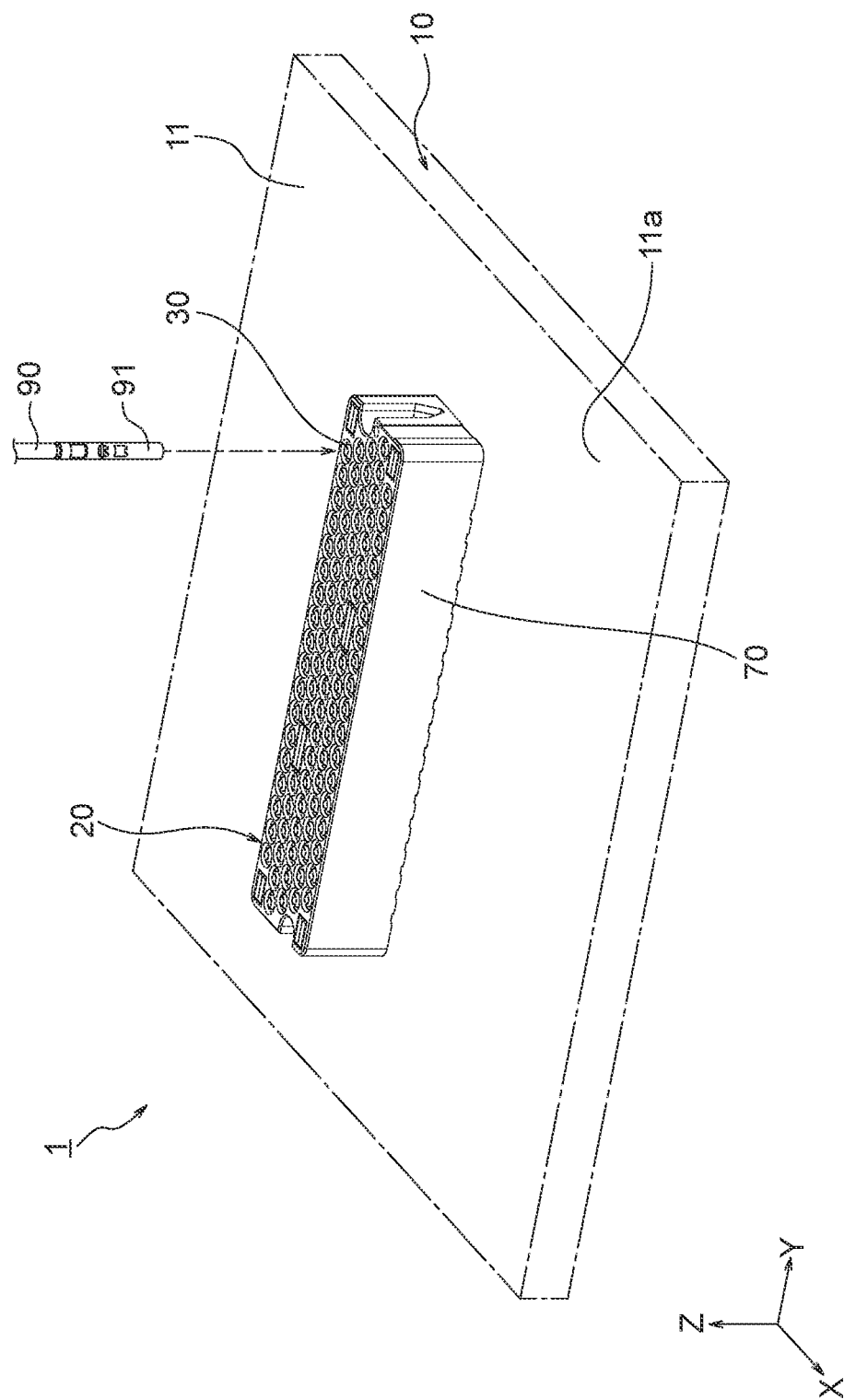
FIG. 1 is a perspective view of a wiring board in one or more embodiments of the present disclosure as viewed from above.
Figure 2:
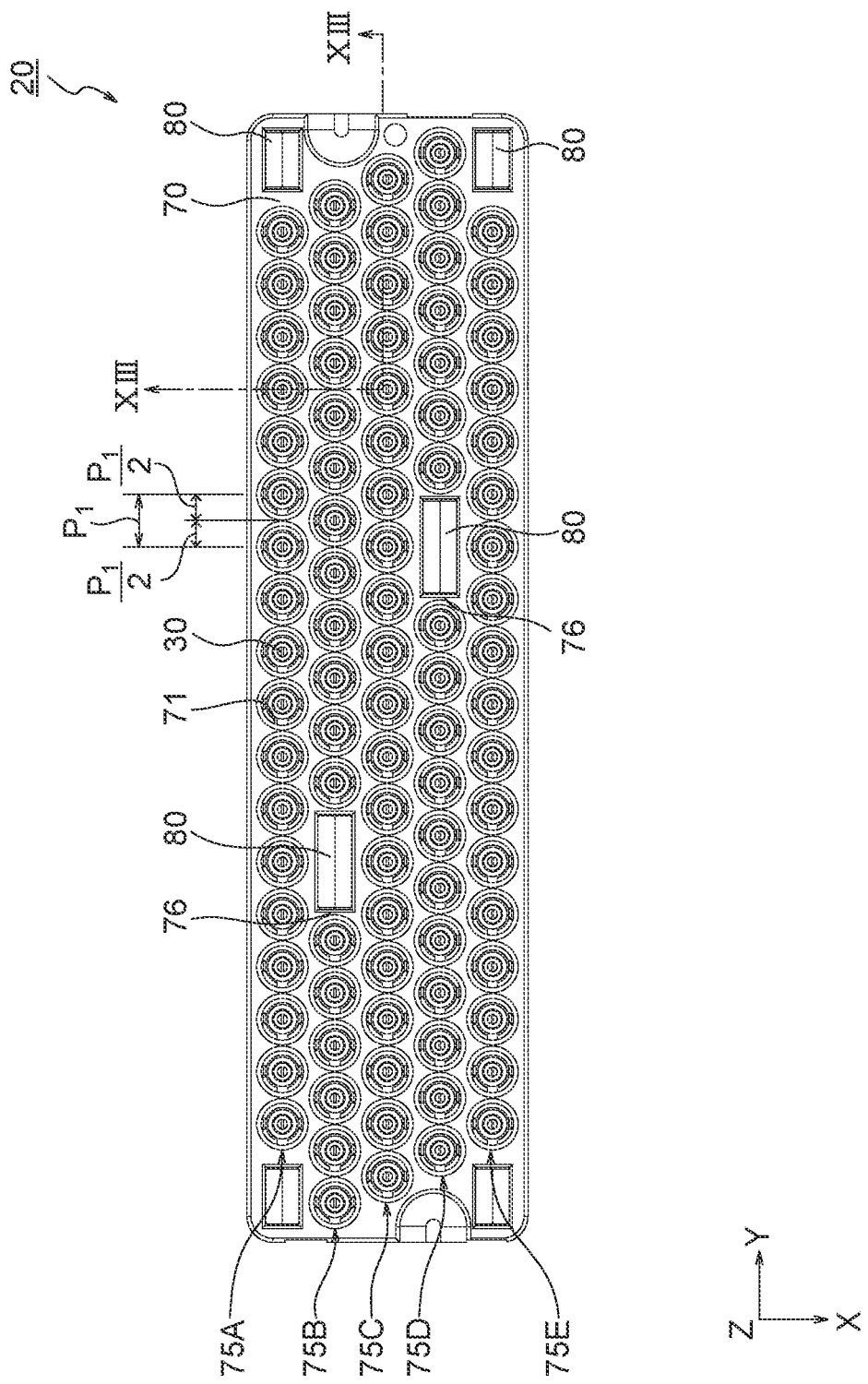
FIG. 2 is a plan view of a coaxial connector in one or more embodiments of the present disclosure.
Figure 3:
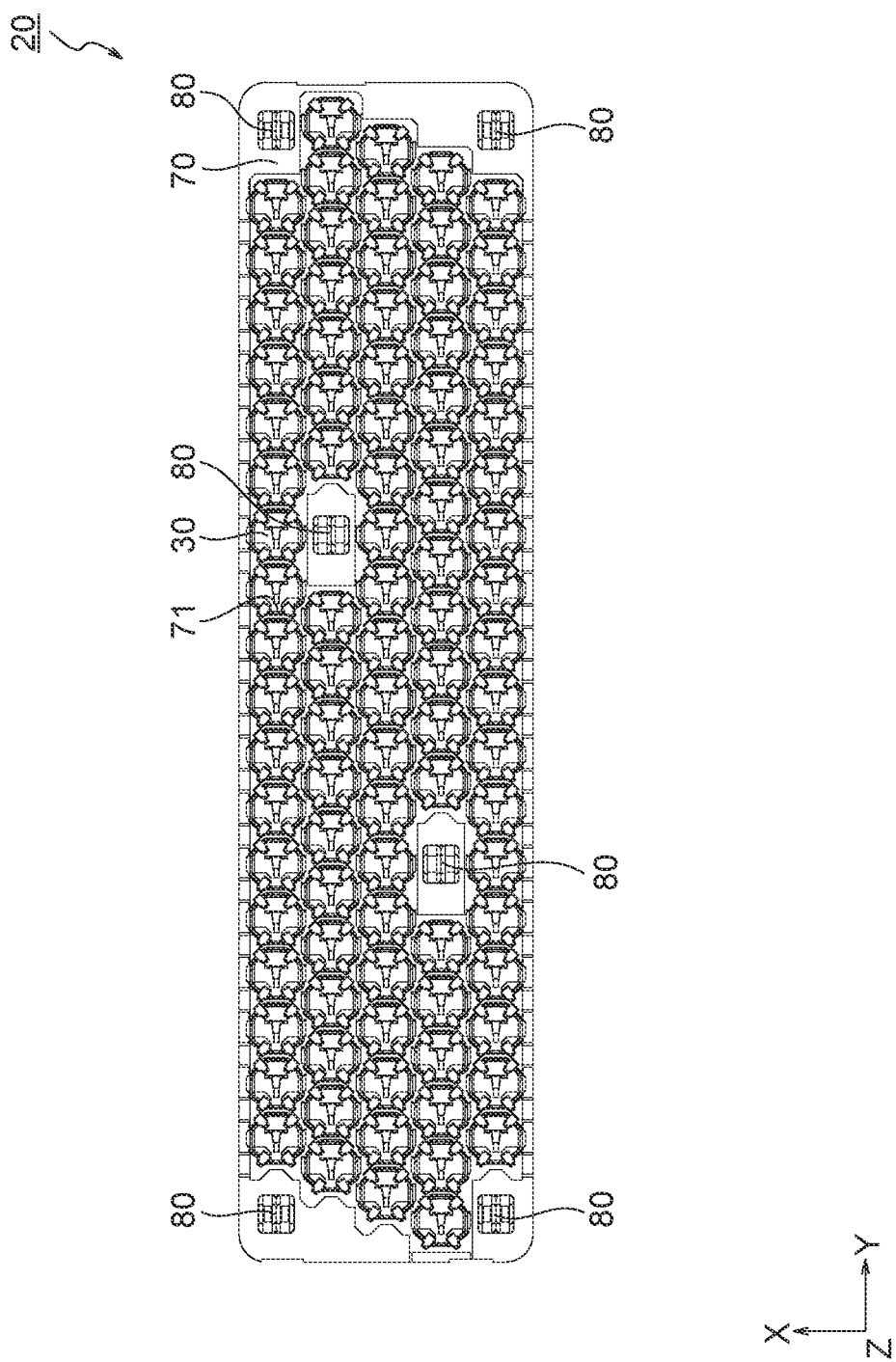
FIG. 3 is a bottom view of the coaxial connector in one or more embodiments of the present disclosure.
Figure 4:
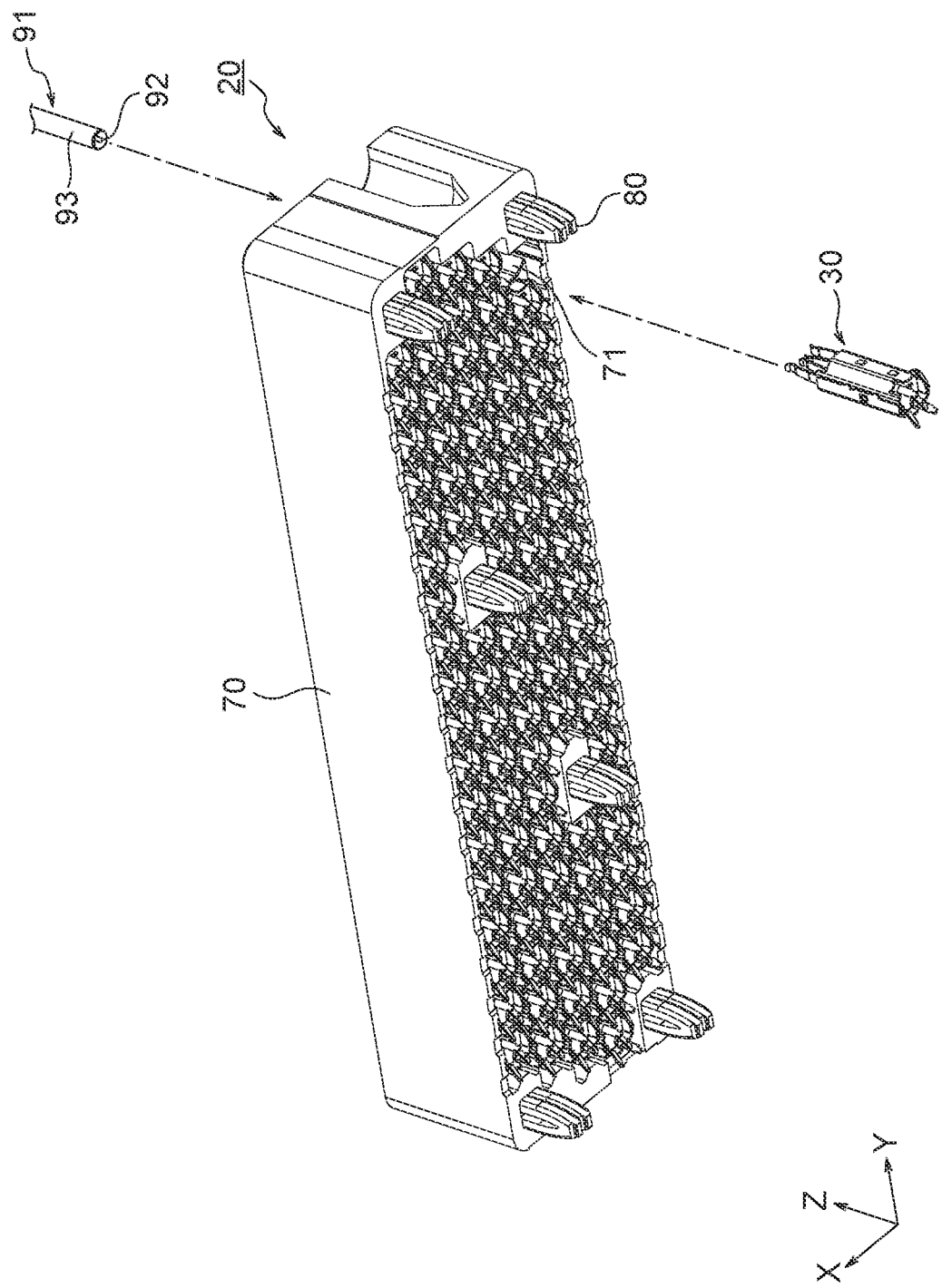
FIG. 4 is an exploded perspective view of the coaxial connector in one or more embodiments of the present disclosure as viewed from below.
Figure 5:
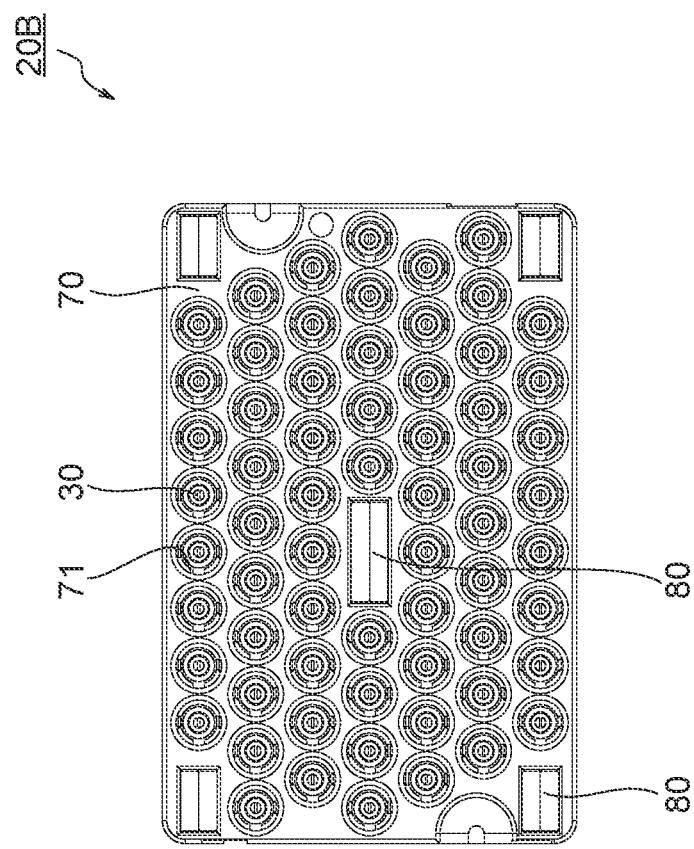
FIG. 5 is a plan view showing a modification of the coaxial connector in one or more embodiments of the present disclosure.

FIG. 1 is a perspective view showing a wiring board in the present embodiment. FIG. 2 is a plan view of a coaxial connector in the present embodiment, FIG. 3 is a bottom view of the coaxial connector in the present embodiment, FIG. 4 is an exploded perspective view of the coaxial connector in the present embodiment as viewed from below. FIG. 5 is a plan view showing a modification of the coaxial connector in the present embodiment.

As shown in FIG. 1 a wiring board 1 in the present embodiment includes a wiring board body 10, and a coaxial connector 20 mounted on the wiring board body 10. As will be described later, the wiring board 1 can be used, for example, as the performance board 120 or the test module 141 of an electronic component testing apparatus 100 (refer to FIG. 19).

The wiring board body 10 is a printed wiring board that includes an insulating substrate 11 having an electrical insulation, and wiring patterns 12 and 13 (refer to FIG. 15) provided on the main surface 11a of the insulating substrate 11. The coaxial connector 20 is electrically connected to the wiring patterns 12 and 13 in a state of being fixed to the wiring board body 10.

The number of coaxial connectors 20 mounted on the wiring board main body 10 is not particularly limited, it is possible to mount any number of coaxial connectors 20 to the wiring board main body 10. For example, when the wiring board 1 is used in the application of the electronic component testing apparatus 100, the number of coaxial connectors 20 mounted on the wiring board main body 10 is set in accordance with the number of sockets 121 (refer to FIG. 16) that the electronic component testing apparatus 100 has. The application of the wiring board according to one or more embodiments of the present disclosure is not limited to the electronic component testing apparatus. Further, in the present embodiment, although the coaxial connector 20 is mounted on the main surface of the wiring board body 10, it is not particularly limited thereto. The coaxial connector 20 may be mounted on the side surface (edge) of the wiring board body 10.

The coaxial connector 20 includes a plurality of coaxial terminals 30, and a housing 70 that holds the coaxial terminals 30, as shown in FIGS. 2 to 4. In the present embodiment, ninety-two coaxial terminals 30 are arranged in a staggered (zigzag) manner.

The number of coaxial terminals that coaxial connector has is not particularly limited to the above. For example, as shown in FIG. 5, the coaxial connector 20B may include sixty-five coaxial terminals 30 arranged in a staggered (zigzag) manner. In the present embodiment, a plurality of coaxial terminals 30 are arranged in a staggered manner, however the arrangement of the coaxial terminals is not particularly limited thereto.

The counterpart coaxial terminal 91 that is connected to the end of the coaxial cable 90 (refer to FIG. 1) is inserted in the coaxial connector 20. The coaxial terminal 91 of the coaxial cable 90 is fitted respectively to the plurality of coaxial terminals 30 of the coaxial connector 20. Thus, the signal terminal 92 (refer to FIG. 4) of the coaxial terminal 91 is electrically connected to the signal terminal 40 (described later) of the coaxial terminal 30 of the coaxial connector 20, and the ground terminal 93 (refer to FIG. 4) of the coaxial terminal 91 is electrically connected to the ground terminal 60 (described later) of the coaxial terminal 30 of the coaxial connector 20.

Figure 6:
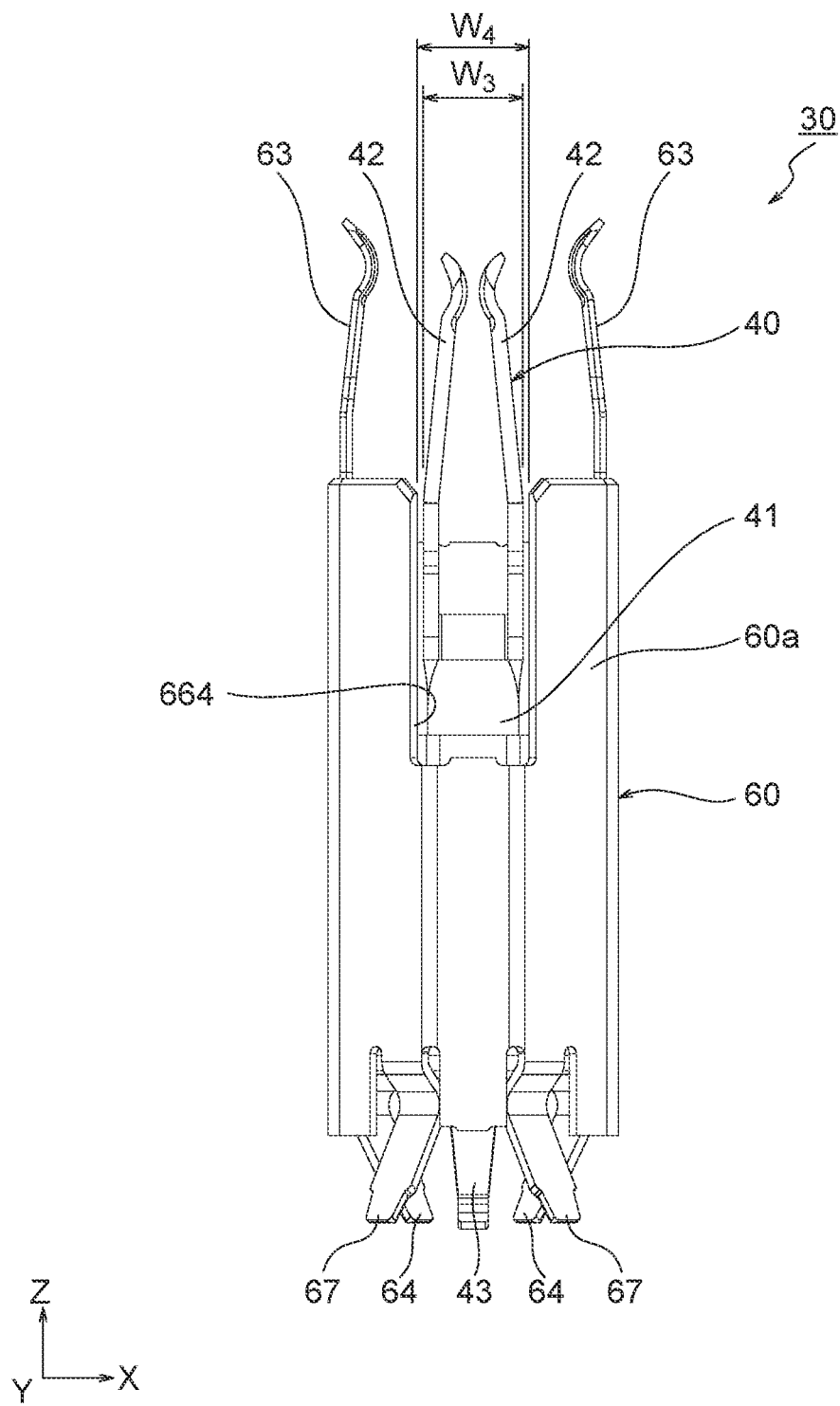
FIG. 6 is a front view showing a coaxial terminal in one or more embodiments of the present disclosure.
Figure 7:
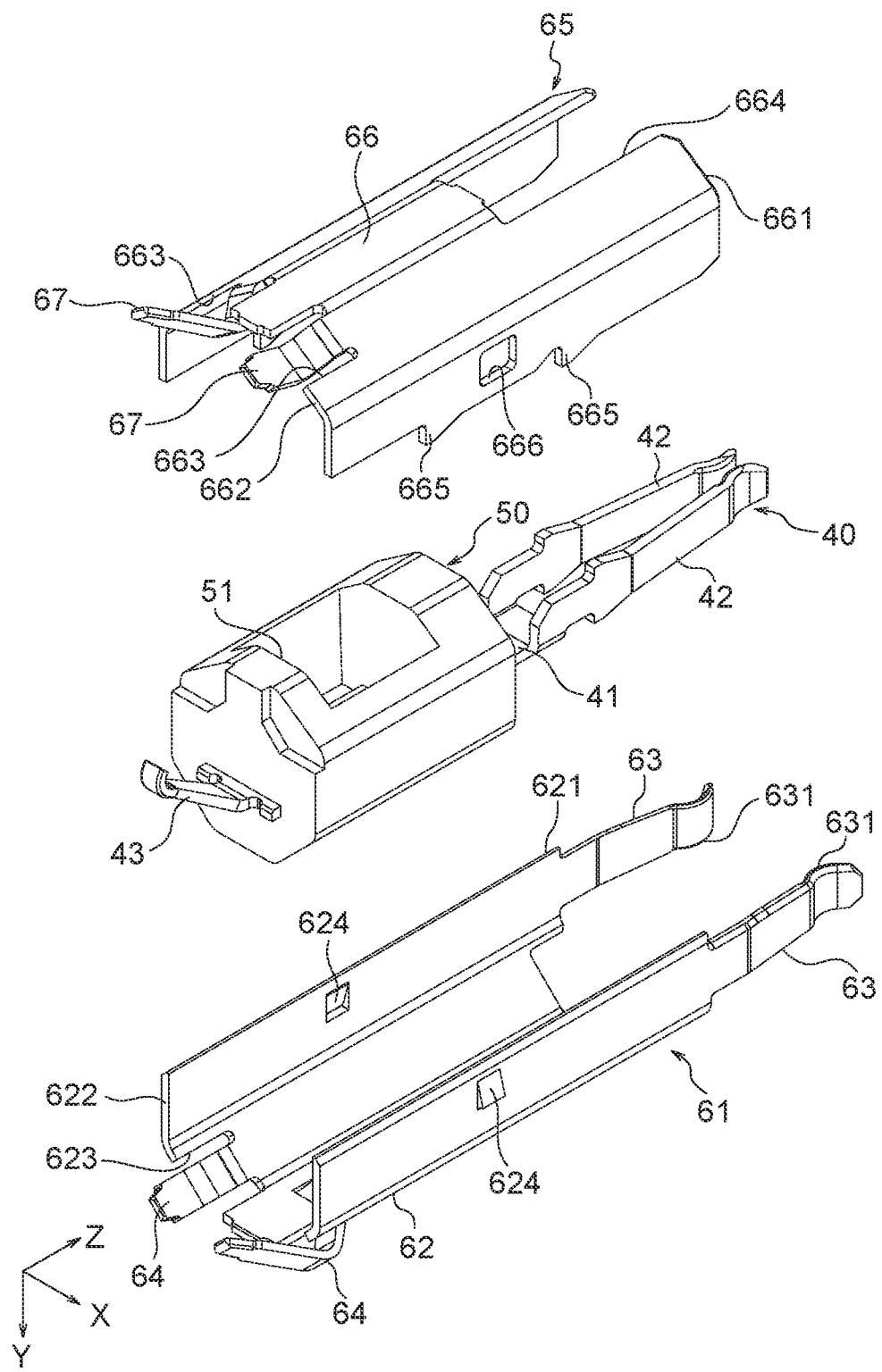
FIG. 7 is an exploded perspective view of the coaxial terminal in one or more embodiments of the present disclosure.
Figure 8:
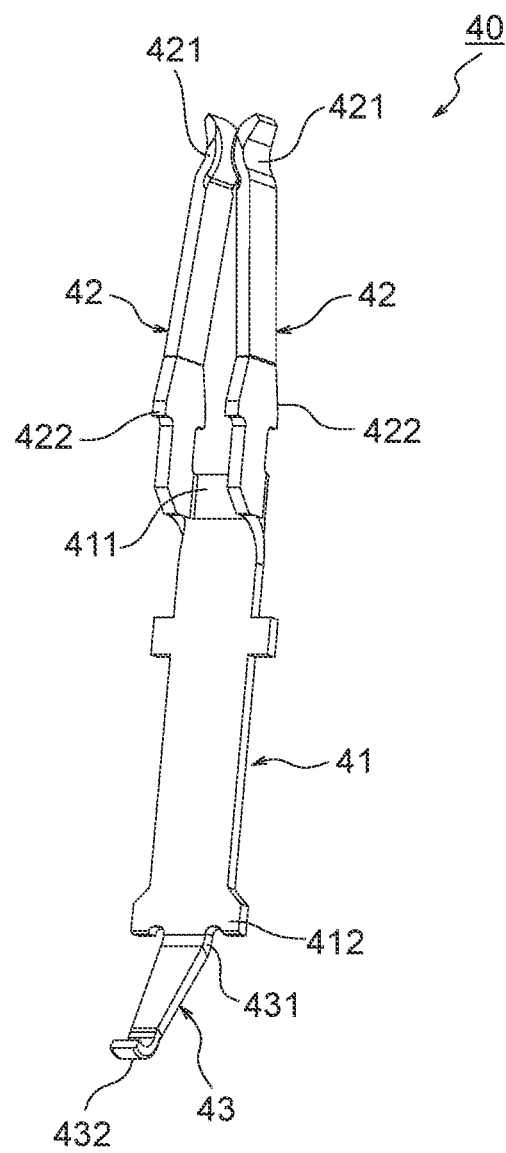
FIG. 8 is a perspective view showing a signal terminal in one or more embodiments of the present disclosure.
Figure 9:
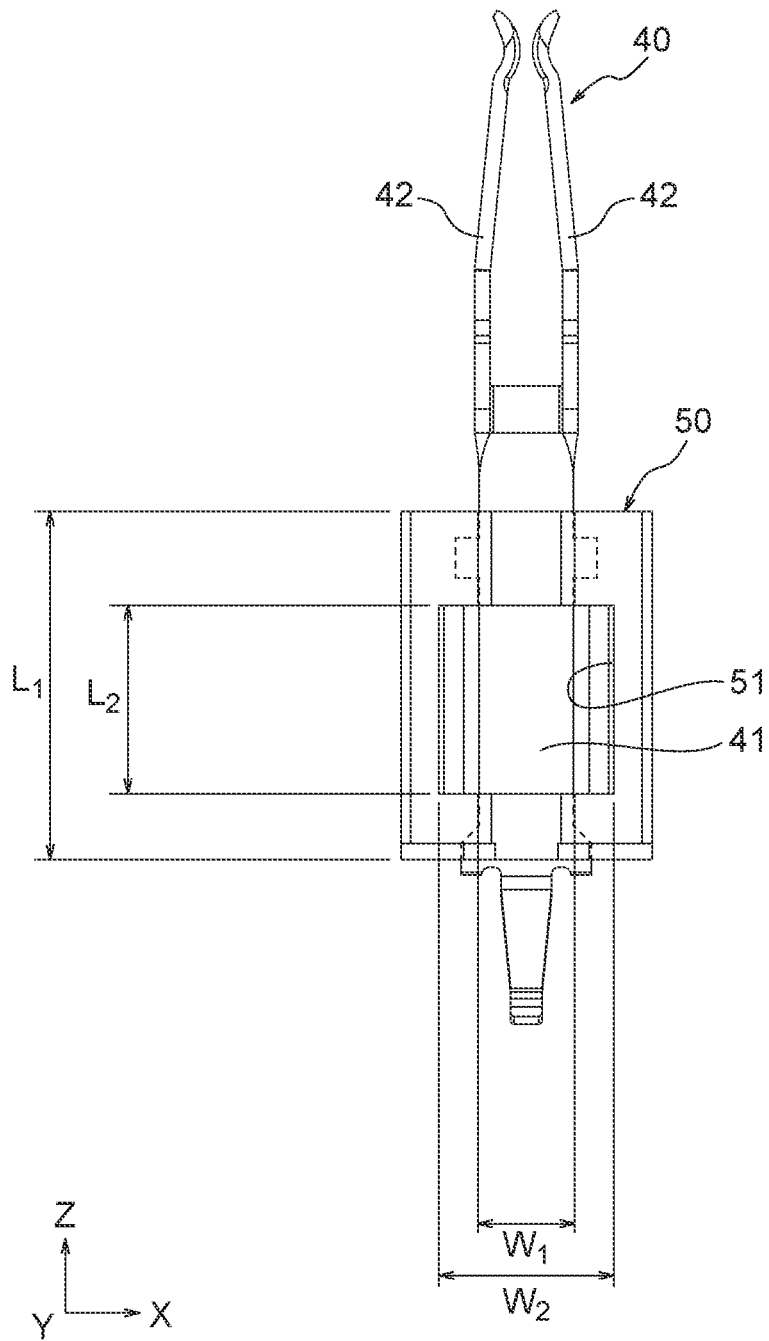
FIG. 9 is a front view showing the signal terminal and an insulating member in one or more embodiments of the present disclosure.
Figure 10:
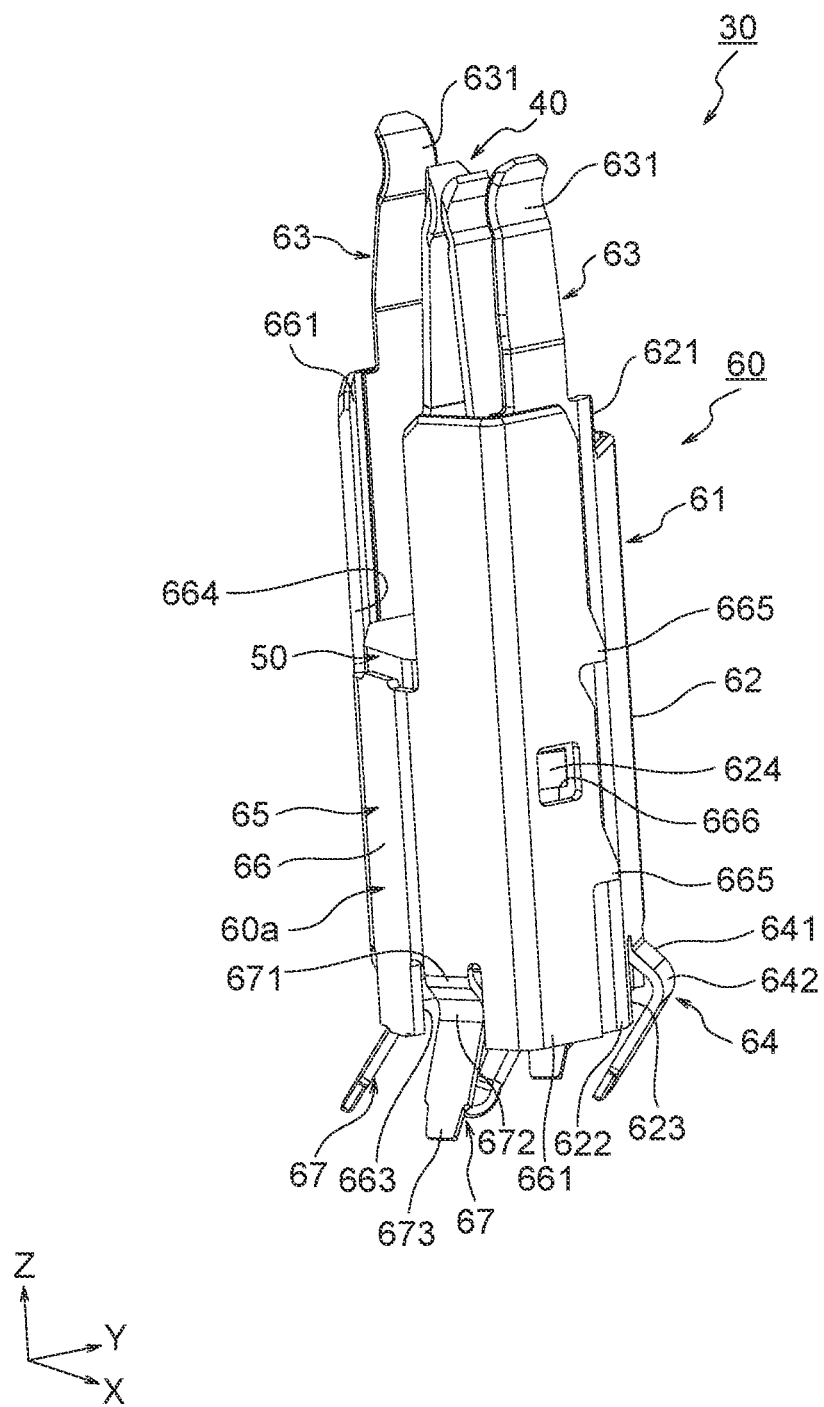
FIG. 10 is a front perspective view of the coaxial terminal in one or more embodiments of the present disclosure.
Figure 11:
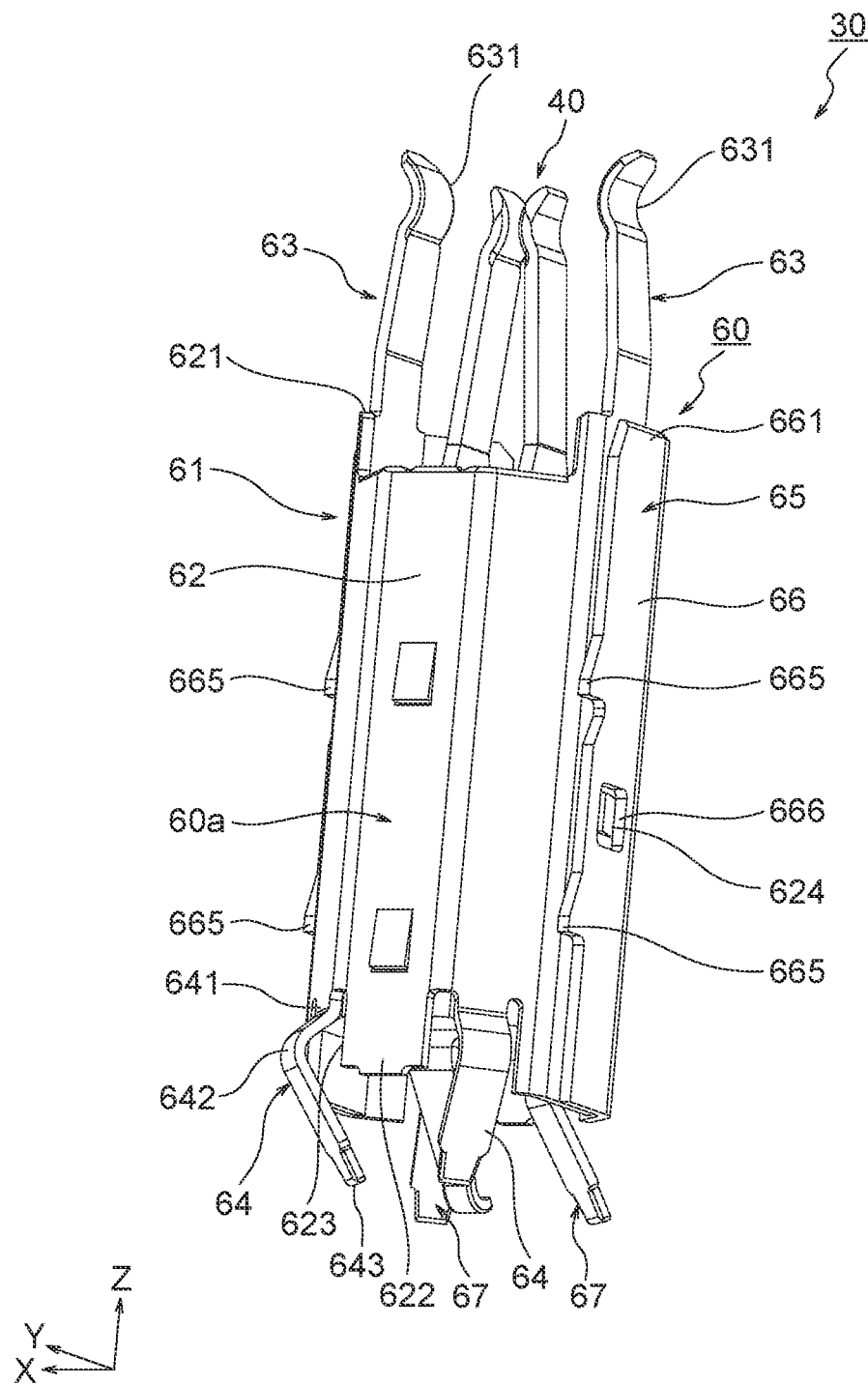
FIG. 11 is a rear perspective view of the coaxial terminal in one or more embodiments of the present disclosure.
Figure 12:
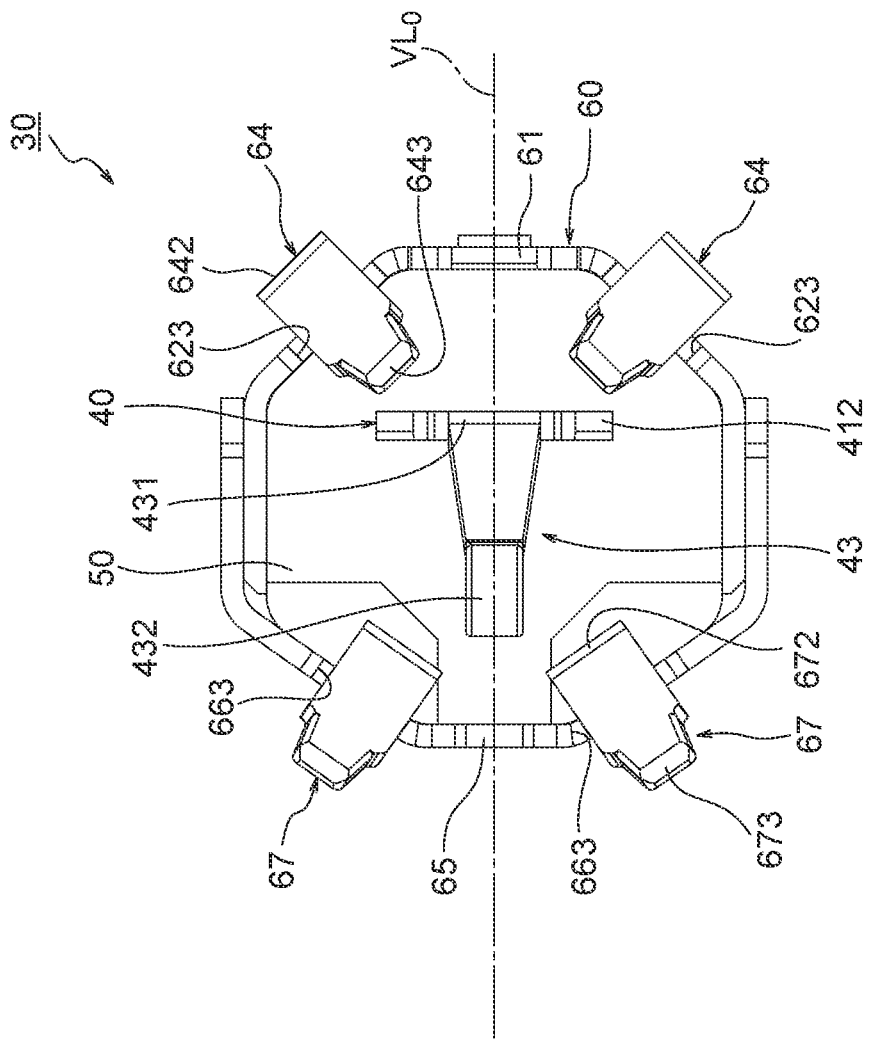
FIG. 12 is a bottom view showing the coaxial terminal in one or more embodiments of the present disclosure.

FIG. 6 is a front view showing the coaxial terminal in the present embodiment, FIG. 7 is an exploded perspective view of the coaxial terminal in the present embodiment. FIG. 8 is a perspective view showing the signal terminal in the present embodiment, FIG. 9 is a front view showing the signal terminal and the insulating member in the present embodiment. FIG. 10 is a front perspective view of the coaxial terminal in the present embodiment, FIG. 11 is a back perspective view of the coaxial terminal in the present embodiment, FIG. 12 is a bottom view showing the coaxial terminal in the present embodiment.

As shown in FIGS. 6 and 7, the coaxial terminal 30 in the present embodiment includes a signal terminal 40, an insulating member (i.e., insulator) 50, and a ground terminal 60. The ground terminal 60 surrounds (i.e., covers) the signal terminal 40 at a predetermined interval (i.e., at intervals) in a tubular (cylindrical) shape. The insulating member 50 is interposed between the signal terminal 40 and the ground terminal 60.

The signal terminal 40 is made of a material having a conductivity such as, for example, a metal material and is formed by performing a bending process after punching a metal plate material. As shown in FIG. 8, the signal terminal 40 includes a main body 41 that extends along the Z direction, a pair of upper contact pieces 42 that extend in the +Z direction side from the main body 41, and a lower contact piece 43 that extends toward the −Z direction side from the main body 41. The main body 41, the upper contact pieces 42, and the lower contact piece 43 are integrally formed.

The main body 41 in the present embodiment corresponds to an example of the "second main body," the upper contact piece 42 in the present embodiment corresponds to an example of the "fifth contact piece," and the lower contact piece 43 in the present embodiment corresponds to an example of the "third contact piece."

A pair of the upper contact pieces 42 protrudes toward the +Z direction from the upper end 411 of the main body 41. The pair of upper contact pieces 42 are opposed to each other in the X direction and is elastically deformable in a direction away from each other. Each of the upper contact pieces 42 has a contact portion 421 having a substantially U-shaped at the tip. The interval between the upper contact pieces 42 is narrower as approaching the tips and is narrowest between the contact portions 421. Further, each of the upper contact piece 42 has claws 422 protruding toward the Y direction in the vicinity of the root portion of the upper contact piece 42.

When the counterpart coaxial terminal 91 is fitted to the coaxial terminal 30, the signal terminal 92 (refer to FIG. 4) of the coaxial terminal 91 enters between the pair of upper contact pieces 42 while pushing and widening between the pair of upper contact pieces 42. Then, the signal terminal 92 is sandwiched between the contact portions 421 of the pair of upper contact pieces 42 so that the signal terminal 40 and the signal terminal 92 of the counterpart coaxial terminal 91 are electrically connected.

In contrast, the lower contact piece 43 is connected to the lower end 412 of the main body 41 at the root portion 431. Since this root portion 431 is curved, the lower contact piece 43 protrudes obliquely downward from the lower end 412 of the main body 41. The lower contact piece 43 is elastically deformable upward with the root portion 431 as a fulcrum. The lower contact piece 43 has a substantially U-shaped contact portion 432 at its tip. When the coaxial connector 20 is mounted on the wiring board body 10, the contact portion 432 contacts the signal wiring pattern 12 (refer to FIG. 15) of the wiring board body 10.

The insulating member 50 is made of a material having an electrical insulation such as, for example, a resin material. As shown in FIGS. 7 and 9, the insulating member 50 is integrally molded with the signal terminal 40 by a molding method such as insert molding. The insulating member 50 has a shape of substantially octagonal prism and covers the main body 41 of the signal terminal 40. The shape of the insulating member 50 is not particularly limited to the above as long as it is a columnar shape, and may be, for example, a round columnar shape.

Further, the insulating member 50 of the present embodiment has an opening 51 which is open in the −Y direction. As shown in FIG. 9, the opening 51 has a length to satisfy the following formula (1) a part of the main body 41 of the signal terminal 40 is exposed from the insulating member 50 through the opening 51.

$$L_2 \geq \tfrac{1}{2} \times L_1 \quad (1)$$

In the above formula (1), $L_1$ is the length of the insulating member 50 along the axial direction (Z direction) of the coaxial terminal 30, $L_2$ is the length of the opening 51 along the axial direction (Z direction).

Here, if the coaxial terminal is simply miniaturized (reduced diameter), the impedance of the coaxial terminal is lowered because the insulating member interposed between the signal terminal and the ground terminal is thin. On the other hand, in the present embodiment, since the opening 51 satisfying the above formula (1) is formed in the insulating member 50, it is possible to interpose much air that has the relative dielectric constant lower than resin thereof between the signal terminal 40 and the ground terminal 60. Therefore, it is possible to maintain the impedance of the coaxial terminal 30 even when the coaxial terminal 30 is miniaturized.

Further, the opening 51 may have a width to satisfy the following formula (2). As a result, it is possible to make the opening 51 sufficiently large.

$$W_2 > W_1 \quad (2)$$

In the above formula (2), $W_1$ is the width of the portion of the main body 41 exposed through the opening 51 and is the width along the width direction (X direction) substantially orthogonal to the axial direction (Z direction) of the coaxial terminal 30. $W_2$ is the width of the opening 51 along the width direction (X direction).

As shown in FIGS. 6, 7, 10 and 11, the ground terminal 60 is formed by assembling the two half-tubular members 61 and 65. The ground terminal 60 has a main body 60a of substantially octagonal tubular (cylindrical) shape, surrounds the signal terminal 40 via the insulating member 50, and holds the signal terminal 40 via the insulating member 50. The shape of the ground terminal 60 is not particularly limited to the above as long as it is a tubular shape. The shape of the ground terminal 60 is set in accordance with the shape of the insulating member 50, and may be, for example, a round cylindrical shape. The ground terminal 60 may be formed of one member.

The first half-tubular member 61 is made of a material having a conductivity such as, for example, a metal material and is formed by performing a bending process after punching a metal plate material. The first half-tubular member 61 includes a main body 62, a pair of upper contact pieces 63, and a pair of inner contact pieces 64. The main body 62 has a half-octagonal tubular shape corresponding to the outer peripheral surface of the insulating member 50. The upper contact pieces 63 extend from the main body 62 in the +Z direction side. On the other hand, the lower inner contact pieces 64 extend from the main body 62 in the −Z direction side. The main body 62, the upper contact pieces 63, and the inner contact pieces 64 are integrally formed.

The pair of upper contact pieces 63 protrude from the upper end 621 of the main body 62 toward the +Z direction. The upper contact pieces 63 are disposed at both ends in the circumferential direction of the main body 62, is opposed to each other in the X direction, and is elastically deformable in a direction away from each other. Further, each of the upper contact pieces 63 has a substantially U-shaped contact portion 631 at the tip and is inclined toward the inside as it approaches the tip. When the counterpart coaxial terminal 91 is fitted to the coaxial terminal 30, the contact portion 631 is electrically connected to the ground terminal 93 (refer to FIG. 4) of the counterpart coaxial terminal 91.

A pair of lower cutouts 623 are formed in the lower end 622 of the main body 62. A root portion 641 of the inner contact piece 64 is connected to the upper edge of the lower cutout 623, and the inner contact piece 64 is bent outward at the root portion 641. Each of the inner contact pieces 64 has a bent portion 642 bent inward and has a substantially L-shape as a whole. The inner contact piece 64 is elastically deformable upward with the root portion 641 and the bent portion 642 as fulcrums. The inner contact piece 64 has a contact portion 643 at the tip. When the coaxial connector 20 is mounted on the wiring board body 10, the contact portion 643 contacts the ground wiring pattern 13 (refer to FIG. 15) of the wiring board body 10.

The main body 62 has a pair of projecting portions 624. The projecting portions 624 are respectively formed in the vicinity of both ends of the main body 62 and project toward the outside (X direction) of the main body 62.

Like the first half-tubular member 61 described above, the second half-tubular member 65 is also made of a conductive material such as, for example, a metal material and is formed by performing a bending process after punching a metal plate material. The second half-tubular member 65 includes a main body 66 and a pair of outer contact pieces 67. Main body 66 has a half-octagonal tubular shape corresponding to the outer peripheral surface of the insulating member 50. The lower outer contact piece 67 extends from the main body 66 toward the −Z direction side. The main body 62 and the outer contact piece 67 are integrally formed. The second half-tubular member 65 has no upper contact piece.

Like the main body 62 of the first half-tubular member 61 described above, a pair of lower cutouts 663 are formed in the lower end 662 of the main body 66. The root portion 671 of the outer contact piece 67 is connected to the upper edge of the lower cutout 663, and the outer contact piece 67 is bent inward at the root portion 671. Each of the outer contact pieces 67 has a bent portion 672 bent outward and has a substantially L-shape as a whole. The outer contact piece 67 is elastically deformable upward with the root portion 671 and the bent portion 672 as fulcrums. The outer contact piece 67 has a contact portion 673 at the tip. When the coaxial connector 20 is mounted on the wiring board body 10, the contact portion 673 contacts the ground wiring pattern 13 (refer to FIG. 15) of the wiring board body 10.

The main body 66 has an upper cutout 664, a plurality of (four in the present example) claws 665, and a pair of through holes 666. The upper cutout 664 is disposed in the center of the circumferential direction of the main body 66 and is open at the upper end 661 of the main body 66. The claws 665 respectively project from both ends of the main body 66 in the +Y direction. The through hole 666 is formed in the vicinity of both ends of the main body 66 so as to correspond to the protrusion 624 of the first half-tubular member 61.

In the present embodiment, the upper cutout 664 of the main body 66 satisfies the following formula (3), and the signal terminal 40 that is covered by the main body 60a of the ground terminal 60 has a portion that is exposed through the cutout 664 as shown in FIG. 6. Thus, even when coaxial terminal 30 is miniaturized, it is possible to maintain or thicken the size of the connecting portion 73 (described later) of the housing 70, and it is possible to securely press-fit and fix the coaxial terminal 30 to the housing 70.

$$W_4 > W_3 \tag{3}$$

In the above formula (3), $W_3$ is the width of the portion of the signal terminal 40 that faces the upper cutout 664 and is the width along the width direction (X direction) substantially orthogonal to the axial direction (Z direction) of the coaxial terminal 30, and $W_4$ is the width of the upper cutout 664 along the width direction (X direction).

As described above, the ground terminal 60 is configured by assembling the first and second half-tubular members 61 and 65 described above. Specifically, as shown in FIG. 7, the ground terminal 60 is formed by assembling the first half-tubular member 61 and the second half-tubular member 65 in a state where the signal terminal 40 that is covered by the insulating member 50 is interposed between the first and second half-tubular members 61 and 65. At this time, the first and second half-tubular members 61 and 65 are fixed by overlapping both ends of the second half-tubular member 65 on the outside of both ends of the first half-tubular member 61 and engaging the protrusion 624 of the first half-tubular member 61 with the through hole 666 of the second half-tubular member 65.

In the present embodiment, as described above, the coaxial terminal 30 is assembled before the coaxial terminal 30 is inserted into the housing 70. However, the timing of assembling the coaxial terminal 30 is not particularly limited thereto. For example, as described in Japanese Unexamined Patent Application Publication No. 2013-26145, the first and second half-tubular members 61 and 65 may be fixed by utilizing the insertion operation of the coaxial terminal 30 into the housing 70.

The ground terminal 60 of the coaxial terminal 30 assembled as described above includes a main body 60a of substantially octagonal tubular shape composed of the main bodies 62 and 66 of the first and second half-tubular members 61 and 65. As shown in FIG. 12, the pair of inner contact pieces 64 are arranged in a position symmetrical about the virtual (imaginary) line $VL_0$. Similarly, the pair of outer contact pieces 67 are also arranged in a position symmetrical about the virtual line $VL_0$. The virtual straight line $VL_0$ is a virtual straight line that passes through the center of the coaxial terminal 30 and is substantially parallel to the Y direction. The virtual straight line $VL_0$ in the present embodiment corresponds to an example of the "centerline of the coaxial terminal."

As shown in FIGS. 10 and 11, the inner contact piece 64 extends from the substantially octagonal tubular main body 60a radially inward of the main body 60a and downward of the main body 60a. More specifically, the inner contact piece 64 is bent toward the outside of the substantially octagonal tubular body 60a at the root portion 641, then a portion between the root portion 641 and the bent portion 642 is located outside the body 60a, and then the inner contact piece 64 is bent toward the inside of the body 60a at the bent portion 642. Therefore, as shown in FIG. 12, when viewed along the axial direction of the coaxial terminal 30 (Z direction), the contact portion 643 of the tip of the inner contact piece 64 is located inside the main body 60a of the substantially octagonal tubular shape.

In contrast, as shown in FIGS. 10 and 11, the outer contact piece 67 extends from the main body 60a of substantially octagonal tubular shape radially outward of the main body 60a and downward of the main body 60a. More specifically, the outer contact piece 67 is bent toward the inside of the main body 60a at the root portion 671, then a portion between the root portion 671 and the bent portion 672 is located inside the main body 60a, and then the outer contact piece 67 is bent toward the outside of the main body 60a at the bent portion 642. Therefore, as shown in FIG. 12, when viewed along the axial direction of the coaxial terminal 30 (Z direction), the contact portion 673 of the tip of the outer contact piece 67 is located outside the main body 60a.

Further, as shown in FIG. 12, when viewed along the axial direction of the coaxial terminal 30 (Z direction), the lower contact piece 43 of the signal terminal 40 is located inside the body 60a of the ground terminal 60. The lower contact piece 43 extends from the lower end 412 of the main body 41 of the signal terminal 40 toward the −Y direction (the direction from the inner contact piece 64 toward the outer contact piece 67) side along the Y direction.

The main body 60a in the present embodiment corresponds to an example of the "first main body." The upper contact piece 63 in the present embodiment corresponds to an example of the "fourth contact piece," the inner contact piece 64 in the present embodiment correspond to an example of the "second contact piece," and the outer contact piece 67 in the present embodiment correspond to an example of the "first contact piece."

Figure 13:
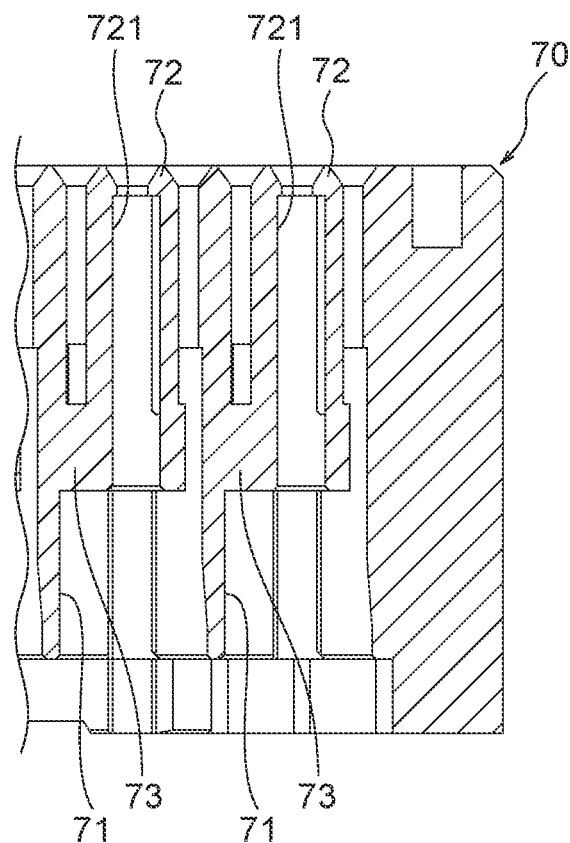
FIG. 13 is an enlarged cross-sectional view of a housing in one or more embodiments of the present disclosure and is a view corresponding to line XIII-XIII of FIG. 2.
Figure 14:
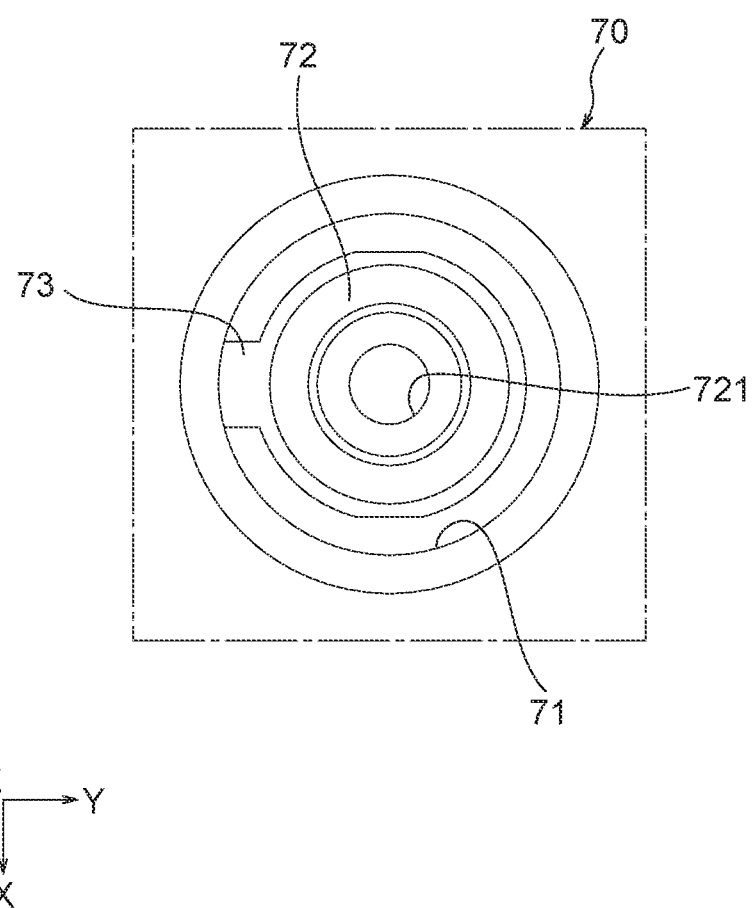
FIG. 14 is an enlarged plan view showing a holding hole of the housing in one or more embodiments of the present disclosure.

FIG. 13 is an enlarged sectional view showing the housing in the present embodiment, FIG. 14 is an enlarged plan view showing the holding hole of the housing in the present embodiment.

The housing 70 is made of an electrically insulating material such as, for example, a resin material and has a substantially rectangular parallelepiped shape as shown in FIGS. 1 to 4. A plurality of (ninety-two in the present embodiment) holding holes 71 are formed in the housing 70. Further, a plurality (six in the present embodiment) of fixing pins 80 each of which is called a "press fit" or the like for fixing the coaxial connector 20 to the wiring board body 10 is buried in the housing 70.

As shown in FIGS. 13 and 14, each of the holding holes 71 penetrates the housing 70 in the vertical direction (Z direction). The holding hole 71 has an octagonal cross-sectional shape with the inner diameter corresponding to the outer diameter of the ground terminal 60 or a circular cross-sectional shape with the inner diameter corresponding to the outer shape of the coaxial terminal 91 as a counterpart terminal.

Further, a substantially round cylindrical holding portion 72 is provided inside the holding hole 71. The holding portion 72 is connected to the inner peripheral surface of the holding hole 71 via the connecting portion 73. Further, the holding portion 72 is formed with a through hole 721 that penetrates the holding portion 72 in the vertical direction (Z direction). The through hole 721 has a circular cross-sectional shape with the inner diameter corresponding to the outer diameter of the signal terminal 40.

Then, when the coaxial terminal 30 is inserted from below into the housing 70 (refer to FIG. 4), the ground terminal 60 of the coaxial terminal 30 is inserted from below into the holding hole 71 and the signal terminal 40 of the coaxial terminal 30 is inserted from below into the through hole 721. Then, the connecting portion 73 of the housing 70 is inserted into the upper cutout 664 of the ground terminal 60 and the claw portion 665 of the ground terminal 60 bites into the inner peripheral surface of the holding hole 71, thereby the ground terminal 60 is fixed to the housing 70. Further, the claw portion 422 of the signal terminal 40 bites into the through hole 721 of the housing 70, thereby the signal terminal 40 is fixed to the housing 70.

The plurality of holding holes 71 are arranged in the housing 70 in a staggered (zigzag) manner. Specifically, as shown in FIG. 2, the housing 70 of the present embodiment have five holding hole groups 75A to 75E. Each of the holding hole groups 75A to 75E consists of a plurality of holding holes 71 that are arranged in a row at substantially the same pitch $P_1$ along the Y direction.

In the first holding hole group 75A at the uppermost row in FIG. 2, the eighteen holding holes 71 are arranged at equal pitches $P_1$ so as to be adjacent to each other. Similarly, in the third holding hole group 75C at the center row, the twenty holding holes 71 are also arranged at equal pitches $P_1$ so as to be adjacent to each other. In the fifth holding hole group 75E at the lowermost row, the eighteen holding holes 71 are also arranged at equal pitches $P_1$ so as to be adjacent to each other.

On the other hand, although the eighteen holding holes 71 are arranged at equal pitches $P_1$ in the second holding hole group 75B at the second row from the top, the second holding hole group 75B has a missing portion 76 between the sixth and seventh holding holes 71 from the left. Similarly, although the eighteen holding holes 71 are arranged at equal pitches $P_1$ in the fourth holding hole group 75D at the second row from the bottom, the fourth holding hole group 75D has a missing portion 76 between the seventh and eighth holding holes 71 from the right.

The first to fifth holding hole groups 75A to 75E adjacent to each other are arranged in parallel so that the holding holes 71 are offset from each other by half a pitch ($P_1/2$). That is, the holding holes 71 in the mutually adjacent holding hole groups 75A to 75E are arranged alternately. Here, the sixth and seventh holding holes 71 in the second holding hole group 75B are separated by distances equivalent to integer multiples (three times in the present embodiment) of the pitch $P_1$ of the holding holes 71. Similarly, the seventh and eighth holding holes 71 in the fourth holding hole group 75D are also separated by distances equivalent to integer multiples (three times in the present embodiment) of the pitch $P_1$ of the holding holes 71. Therefore, even if the second and fourth hold hole groups 75B,75D have the missing portions 76, it is possible to arrange the first to fifth holding hole groups 75A to 75E alternately and regularly.

The fixing pins 80 are disposed on both sides of the first holding hole group 75A. Similarly, the fixing pins 80 are arranged on both sides of the fifth holding hole group 75E. In addition, the fixing pin 80 is arranged in the missing portions 76 of the second holding hole group 75B. Similarly, the fixing pin 80 is arranged in the missing portion 76 of the fourth holding hole group 75D. As shown in FIG. 4, these fixing pins 80 are embedded in the housing 70, and its tip protrudes downward from the lower surface of the housing 70.

Thus, in the present embodiment, since the plurality of fixing pins 80 are arranged at a position asymmetrical with the center of the upper surface of the housing 70 as a symmetrical point, it is possible to prevent mismounting of the coaxial connector 20 to the wiring board body 10.

Further, in the present embodiment, since the fixing pins 80 are disposed in the group 75B, 75D of the holding holes 71, it is possible to stably fix the coaxial connector 20 to the wiring board body 10.

Figure 15:
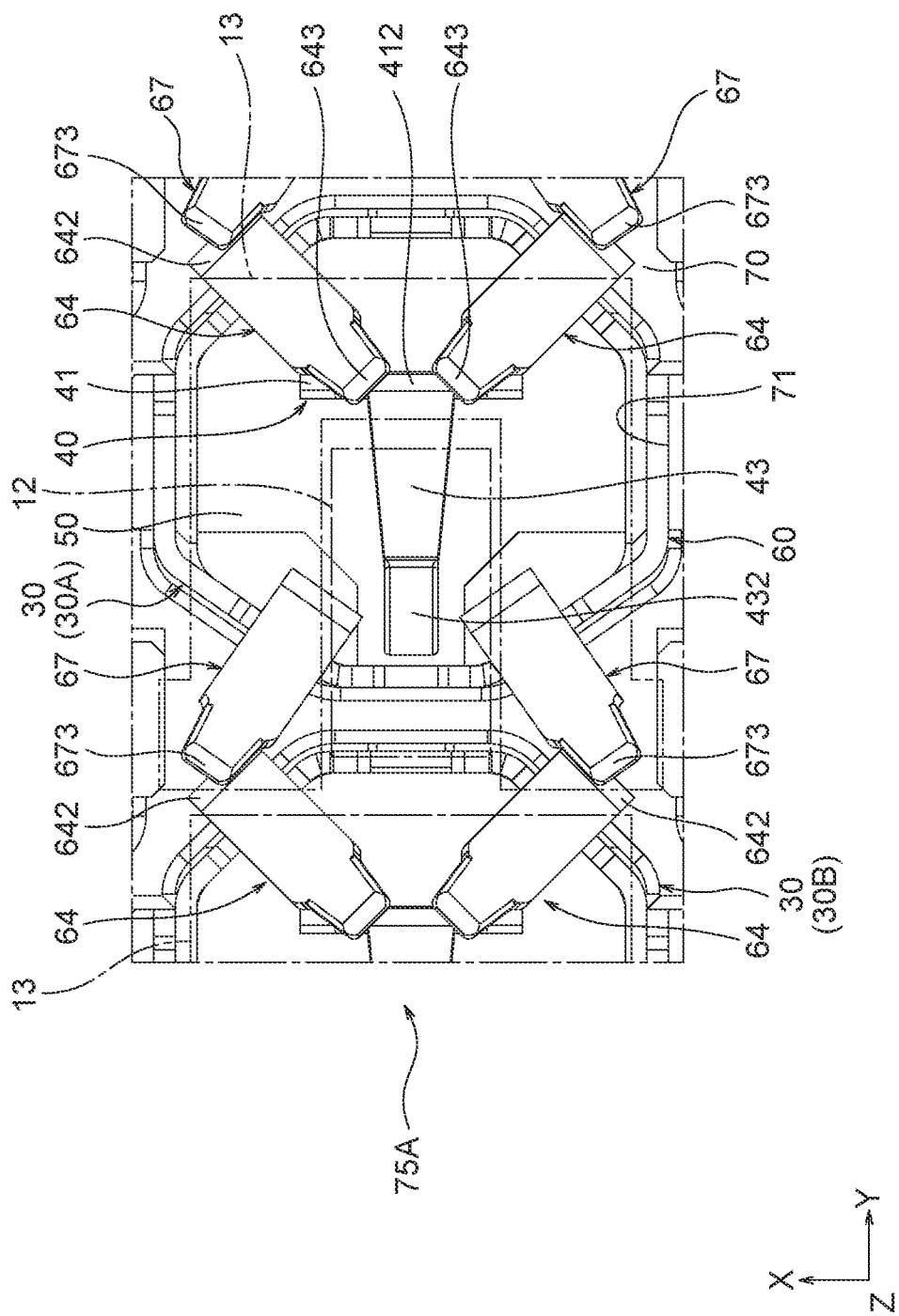
FIG. 15 is a transparent plan view taken through the wiring board from below in one or more embodiments of the present disclosure and is a diagram showing the positional relationship between the coaxial terminal and the wiring pattern.
Figure 16:
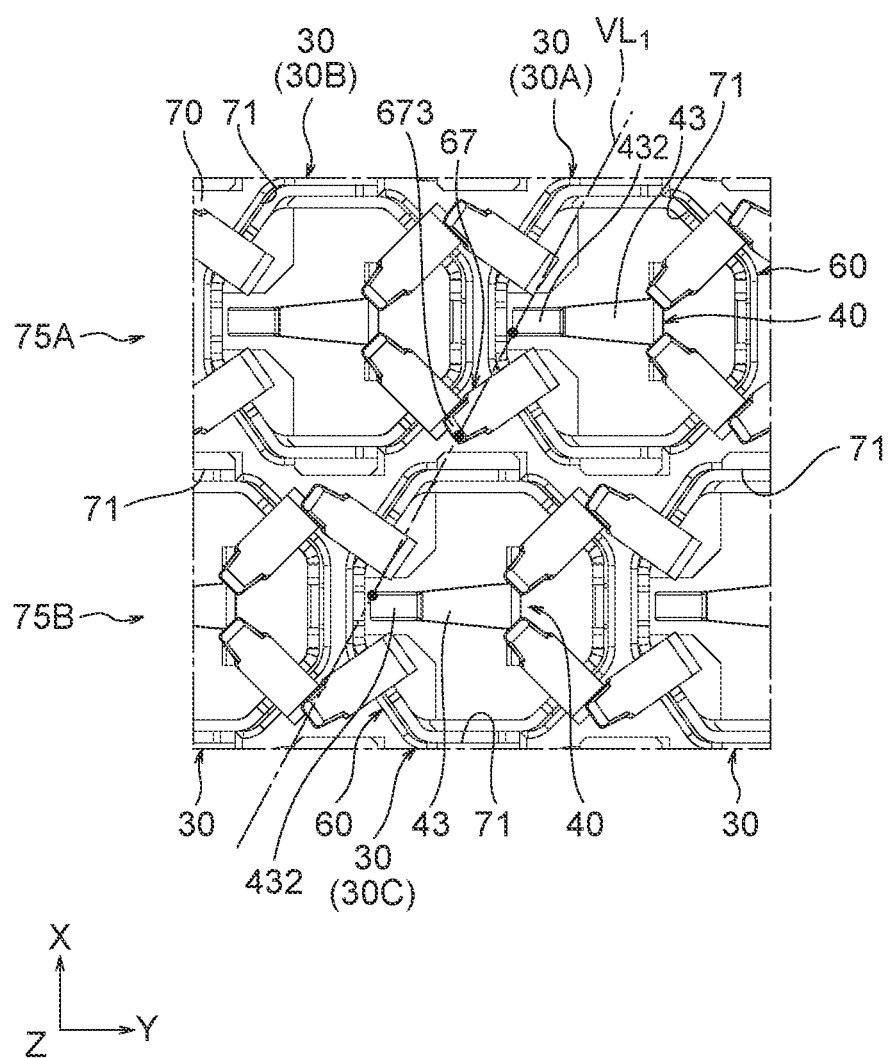
FIG. 16 is a transparent plan view taken through the wiring board from below in one or more embodiments of the present disclosure and is a diagram showing the positional relationship between the outer contact piece of the ground terminal and the signal terminals in rows adjacent to each other.
Figure 17:
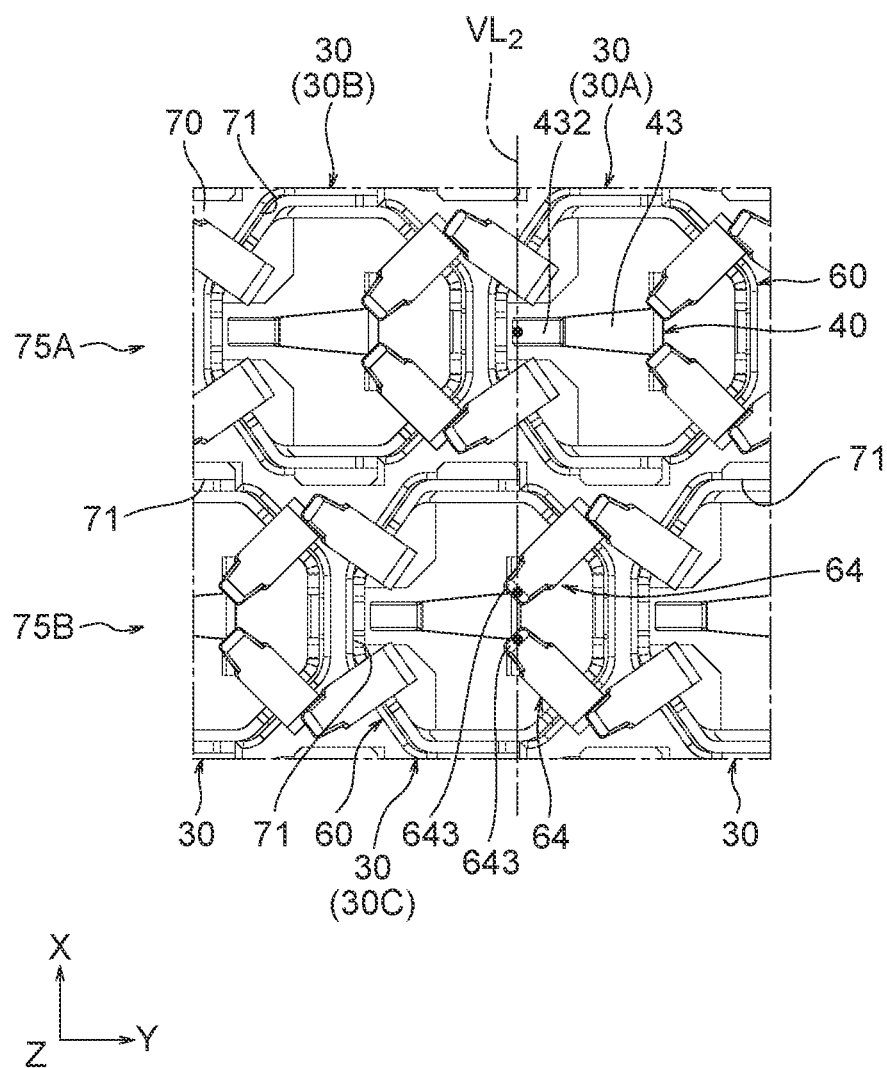
FIG. 17 is a transparent plan view taken through the wiring board from below in one or more embodiments of the present disclosure and is a diagram showing the positional relationship between the signal terminal and the inner contact piece in an adjacent row.
Figure 18:
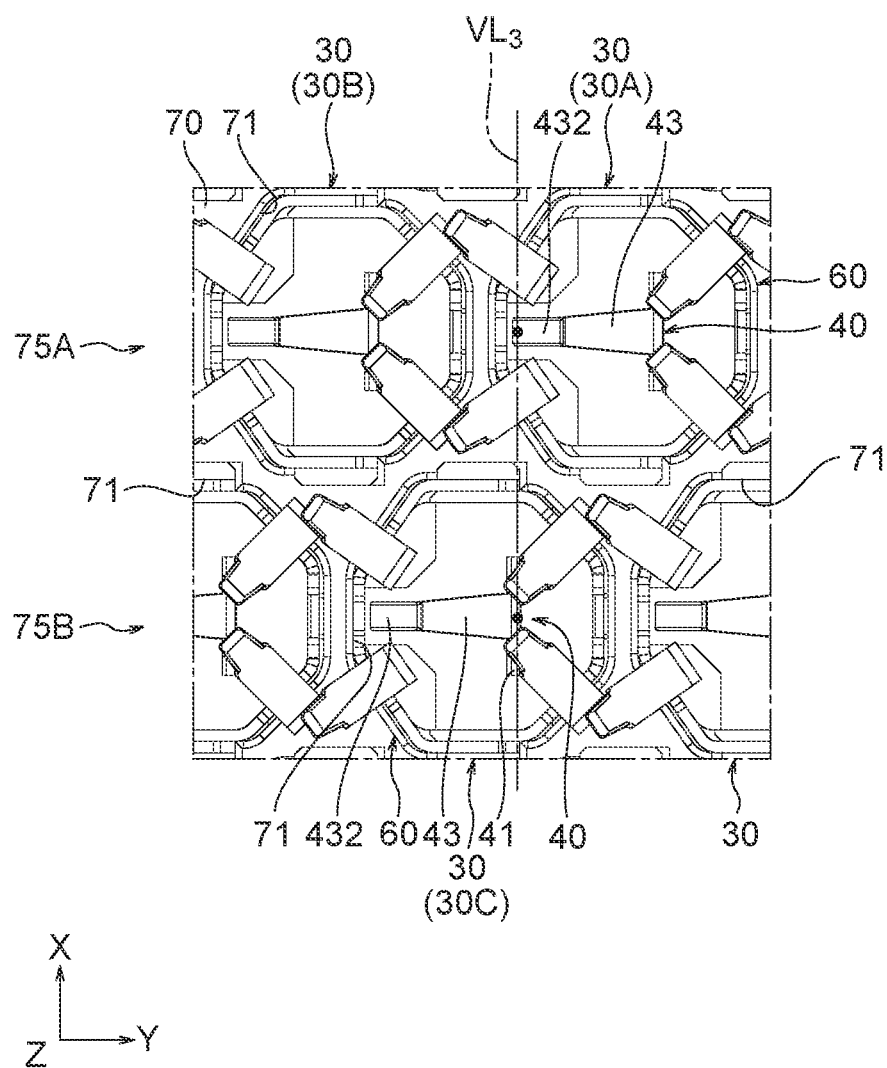
FIG. 18 is a transparent plan view taken through the wiring board from below in one or more embodiments of the present disclosure and is a diagram showing the positional relationship between the signal terminals in rows adjacent to each other.

FIGS. 15 to 18 are transparent plan views taken through the wiring board from below in the present embodiment. FIG. 15 is a diagram showing the positional relationship between the coaxial terminal and the wiring pattern and showing the positional relationship between the outer contact piece and the inner contact piece of the ground terminals adjacent with each other in the same row. FIG. 16 is a diagram showing the positional relationship between the outer contact piece of the ground terminal and the signal terminals in rows adjacent to each other, FIG. 17 is a diagram showing the positional relationship between the signal terminal and the inner contact piece in an adjacent row, and FIG. 18 is a diagram showing the positional relationship between the signal terminals in rows adjacent to each other.

Incidentally, each of FIGS. 15 to 18 shows a state in which the coaxial connector 20 is mounted on the wiring board body 10. In this state, the lower contact piece 43 of the signal terminal 40 is pushed by the wiring board body 10 so as to be elastically deformed, each of the contact pieces 64 and 67 of the ground terminal 60 is also pushed by the wiring board body 10 so as to be elastically deformed. In contrast, FIG. 12 shows a state before the coaxial connector 20 is mounted on the wiring board body 10. In this state, each of the contact pieces 43, 64, 67 of the coaxial terminal 30 is not elastically deformed and is not pushed by the wiring board body 10.

The coaxial connector 20 described above is mounted on the wiring board body 10. The coaxial connector 20 is fixed to the insulating substrate 11 by inserting the fixing pin 80 that protrudes from the housing 70 into the mounting hole (not shown) of the insulating substrate 11.

In the present embodiment, as shown in FIG. 15, in a state where the coaxial connector 20 is mounted on the wiring board body 10, the contact portion 432 of the lower contact piece 43 of the signal terminal 40 is in contact with the signal wiring pattern 12 of the wiring board body 10. At this time, the lower contact piece 43 is elastically deformed with the root portion 431 as a fulcrum, and the contact portion 432 is pressed against the signal wiring pattern 12, thereby the signal terminal 40 is electrically connected to the signal wiring pattern 12. Due to the elastic deformation of the lower contact piece 43, the contact portion 432 of the lower contact piece 43 is moved in the −Y direction in comparison with the state before the coaxial connector 20 is mounted on the wiring board body 10 (refer to FIG. 12).

Further, in a state where the coaxial connector 20 is mounted on the wiring board body 10, the contact portion 643 of the inner contact piece 64 of the ground terminal 60 is in contact with the ground wiring pattern 13 of the wiring board body 10. At this time, the inner contact piece 64 is elastically deformed with the root portion 641 and the bent portion 642 as fulcrums, and the contact portion 643 is pressed against the ground wiring pattern 13.

Similarly, in a state where the coaxial connector 20 is mounted on the wiring board body 10, the contact portion 673 of the outer contact piece 67 of the ground terminal 60 is in contact with the ground wiring pattern 13 of the wiring board body 10. At this time, the outer contact piece 67 is elastically deformed with the root portion 671 and the bent portion 672 as fulcrums, and the contact portion 673 is pressed against the ground wiring pattern 13.

Thus, the ground terminal 60 is electrically connected to the ground wiring pattern 13 by pressing the contact portions 643, 673 of the inner contact piece 64 and the outer contact piece 67 against the ground wiring pattern 13. In the present embodiment, as shown in FIG. 15, the signal wiring pattern 12 of the wiring board body 10 has a substantially rectangular planar shape. On the other hand, the ground wiring pattern 13 has a substantially U-shaped planar shape and surrounds the signal wiring pattern 12. The signal wiring pattern 12 in the present embodiment corresponds to an example of the "first wiring pattern," and the ground wiring pattern 13 in the present embodiment corresponds to an example of the "second wiring pattern."

In the present embodiment, due to the elastic deformation of the outer contact piece 67, the contact portion 673 of the outer contact piece 67 is moved radially outward of the main body 60a in comparison with the state before the coaxial connector 20 is mounted on the wiring board body 10 (refer to FIG. 12).

In the present embodiment, therefore, a part of the outer contact piece 67 of the coaxial terminal 30 (the coaxial terminal 30A in FIG. 15) overlaps with a part of the inner contact piece 64 of the adjacent coaxial terminal 30 (the coaxial terminal 30B in FIG. 15) in the transparent plan view that is seen through the wiring board 1 along the normal direction (the Z direction) of the wiring board body 10. More specifically, the contact portion 673 of the outer contact piece 67 of the coaxial terminal 30A overlaps with the bent portion 642 of the inner contact piece 64 of the adjacent coaxial terminal 30B in the transmission plan view. In this state, the outer contact piece 67 of the coaxial terminal 30A is not in contact with the inner contact piece 64 of the adjacent coaxial terminal 30B. The coaxial terminals 30A and 30B are the coaxial terminals 30 that are inserted into the holding holes 71 that are adjacent to each other in the same holding hole group (the holding hole group 75A in FIG. 15).

In this way, since the outer contact piece 67 and the inner contact piece 64 of the coaxial terminals 30 that are adjacent to each other overlap with each other, it is possible to narrow the distance between the coaxial terminals 30 that are adjacent to each other and to arrange the coaxial terminals 30 in a high density. Further, since the outer contact piece 67 and the inner contact piece 64 of the coaxial terminals 30 that are adjacent to each other overlap with each other, it is possible to densely interpose the outer contact piece 67 and the inner contact piece 64 between the signal terminals 40 and to improve the shielding performance of the coaxial terminal 30.

In the present embodiment, due to the elastic deformation of the inner contact piece 64, the contact portion 643 of the inner contact piece 64 is moved radially inward of the main body 60a in comparison with the state before the coaxial connector 20 is mounted on the wiring board body 10 (refer to FIG. 12). Therefore, in the present embodiment, a part of the pair of the inner contact piece 64 of the coaxial terminal 30 respectively overlaps with a part of the signal terminal 40 of the same coaxial terminal 30 in the transparent plan view. More specifically, the contact portions 643 of the pair of the inner contact pieces 64 respectively overlap with the lower end 412 of the main body 41 of the signal terminal 40. In this state, the inner contact pieces 64 are not in contact with the main body 41 of the signal terminal 40.

In this way, since the pair of the inner contact pieces 64 of the coaxial terminal 30 respectively overlap with the signal terminal 40, it is possible to densely interpose the inner contact pieces 64 between the signal terminals 40 and to improve the shielding performance of the coaxial terminal 30. Since the pair of the inner contact pieces 64 of the coaxial terminal 30 respectively overlap with the signal terminal 40, it is possible to reduce the size of the coaxial terminal 30 itself and to arrange the coaxial terminals in a high density.

In the present embodiment, as shown in FIG. 16, the contact portion 673 of the one side (lower side in the figure) outer contact piece 67 of the ground terminal 60 of the coaxial terminal 30 (the coaxial terminal 30A in FIG. 16) is located on the virtual straight line $VL_1$ in the transparent plan view. The virtual straight line $VL_1$ is a virtual straight line that passes through the contact portion 432 of the signal terminal 40 of the coaxial terminal 30 (the coaxial terminal 30A in FIG. 16) and the contact portion 432 of the signal terminal 40 of the coaxial terminal 30 (the coaxial terminal 30C in FIG. 16) inserted in the adjacent holding hole group (the holding hole group 75B in FIG. 16). Specifically, the virtual straight line $VL_1$ passes the adjacent coaxial terminal 30C side end (the lower side end in the figure) in the tip of the contact portion 432 of the coaxial terminal 30A and the adjacent coaxial terminal 30A side end (the upper side in the figure) in the tip of the contact portion 432 of the coaxial terminal 30C.

In this way, since the contact portion 673 of one outer contact piece 67 of the ground terminal 60 of the coaxial terminal 30A is interposed between the contact portions 432 of the signal terminals 40 of the coaxial terminals 30A and 30C in the adjacent groups, it is possible to enhance the shielding effect between the coaxial terminals 30 in the adjacent groups.

In the present embodiment, as shown in FIG. 17, a part of the signal terminal 40 of the coaxial terminal 30 (the coaxial terminal 30A in FIG. 17) is located on the virtual straight line $VL_2$ in the transparent plan view. The virtual straight line $VL_2$ is a virtual straight line that extends in a direction (the X direction) substantially perpendicular to an arrangement direction (the Y direction) of the coaxial terminals that are included in the same group and passes through the contact portion 643 of the inner contact piece 64 of the ground terminal 60 of the coaxial terminal 30 (the coaxial terminal 30C in FIG. 17) in the adjacent group.

In this way, since the signal terminal 40 of the coaxial terminal 30A is located on the virtual straight line $VL_2$ that passes the contact portions 432 of the pair of inner pieces 43 of the ground terminal 60 of the coaxial terminal 30C in the adjacent group, it is possible to narrow the pitch between the coaxial terminals 30 and to reduce the size of the coaxial terminal 30. The virtual straight line $VL_2$ in the present embodiment corresponds to an example of the "second virtual straight line."

In the present embodiment, as shown in FIG. 18, a part of the signal terminal 40 of the coaxial terminal 30 (the coaxial terminal 30A in FIG. 18) is located on the virtual straight line $VL_3$ in the transparent plan view. The virtual straight line $VL_3$ is a virtual straight line that extends in a direction (the X direction) substantially perpendicular to an arrangement direction (the Y direction) of the coaxial terminals that are included in the same group and passes through a part (more specifically, the lower end 412 of the main body 41) of the signal terminal 40 of the coaxial terminal 30 (the coaxial terminal 30C in FIG. 18) that is inserted in the adjacent holding hole group (the holding hole group 75C in FIG. 18).

In this way, since the signal terminals 40 of the coaxial terminals 30A, 30C that are adjacent to each other is located on the virtual straight line $VL_3$, it is possible to narrow the pitch between the coaxial terminals 30 and to reduce the size of the coaxial terminal 30. The virtual straight line $VL_3$ in the present embodiment corresponds to an example of the "third virtual straight line."

In the present embodiment, as shown in FIGS. 15 to 18, in the transparent plan view, the root portion 431 of the signal terminal 40 of the one coaxial terminal 30B is interposed between the contact portions 432 of the lower contact pieces 43 of the signal terminals 40 of the coaxial terminals 30 that are adjacent to each other in the Y direction, and, in addition, the root portion 431 overlaps with the contact portions 643 of the pair of the inner contact pieces 64 of the ground terminal 61 of the coaxial terminal 30B.

In this way, since the root portion 431 of the signal terminal 40 of the one coaxial terminal 30B overlaps with the contact portions 643 of the inner contact pieces 64 of the ground terminal 61 of the coaxial terminal 30B, it is possible to densely interpose the inner contact piece 64 between the signal terminals 40 and to reduce crosstalk between the coaxial terminal 30A, 30B that are adjacent to each other in the X direction. Since the root portion 431 of the signal terminal 40 of the coaxial terminal 30B overlaps with the contact portion 643 of the inner contact piece 64 of the ground terminal 60 of the coaxial terminal 30B, it is possible to reduce the size of the coaxial terminal 30 itself and to arrange the coaxial terminals in a high density.

FIG. 19 is a schematic diagram showing the configuration of an electronic component testing apparatus in the present embodiment.

The wiring board 1 with the coaxial connector 20 described above can be used as a performance board 120 or a test module 141 of the electronic component testing apparatus 100 shown in FIG. 19.

As shown in FIG. 19, the electronic component testing apparatus 100 includes a test head 110 and a tester 150, and the test head 110 includes a performance board 120, a motherboard 130, and a test head body 140. The configuration of the electronic component testing apparatus 100 shown in FIG. 19 is only an example, and the configuration of the electronic component testing apparatus that the wiring board according to one or more embodiments of the present disclosure may be applied to is not particularly limited thereto.

A plurality of sockets 121 that DUT200 are pressed to by a handler (not shown) are mounted on the top surface of the performance board 120. Although not particularly limited, SoCs (System on a chip), logic devices, and memory device may be exemplified as a specific example of DUT200 to be tested. A plurality of coaxial connectors 122 are mounted on the underside of the performance board 120. The socket 121 and the coaxial connector 122 are electrically connected via a wiring pattern (not shown) or the like. The coaxial connector 20 described above can be used as the coaxial connector 122.

The motherboard 130 includes a plurality of coaxial cables 131. The coaxial cable 131 has the same configuration as the coaxial cable 90 described above. The upper end of the coaxial cable 131 is held by a holder 132 that is provided in the upper portion of the motherboard 130, and the lower end of the coaxial cable 131 is also held by a holder 133 that is provided in the lower portion of the motherboard 130. When the performance board 120 is attached to the motherboard 130, the coaxial connector 122 of the performance board 120 and the coaxial terminal at one end of the coaxial cable 131 of the motherboard 130 are fitted to each other.

Test head body 140 includes a plurality of test modules 141 (pin electronics cards). A coaxial connector 142 is mounted on the upper edge of each test module 141. When the motherboard 130 is attached to the test head body 140, the coaxial terminal at the other end of the coaxial cable 131 of the motherboard 130 and the coaxial connector 142 of the test head body 140 are fitted to each other. The coaxial connector 20 described above can be used as the coaxial connector 142. Each test module 141 is connected to a tester 150 via a cable 151, generates a test signal in response to an instruction from the tester 150, and sends to DUT 200.

As described above, in the present embodiment, since a part of the outer contact piece 67 of the coaxial terminal 30 overlaps with a part of the inner contact piece 64 of the adjacent coaxial terminal 30 in the transparent plan view, it is possible to narrow the distance between the coaxial terminals 30 that are adjacent to each other and to arrange the coaxial terminals 30 in a high density. Further, since it is possible to densely interpose the outer contact piece 67 and the inner contact piece 64 between the signal terminals 40, it is possible to improve the shielding performance of the coaxial terminal 30. Therefore, in the present embodiment, it is possible to arrange the coaxial terminals 30 in a high density and to ensure desired electrical characteristics.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATIONS OF LETTERS OR NUMERALS

1 . . . Wiring board
10 . . . Wiring board body
12 . . . Signal wiring pattern
13 . . . Ground wiring pattern
20, 20B . . . Coaxial connector
30 . . . Coaxial terminal
40 . . . Signal terminal
41 . . . Main Body
42 . . . Upper contact piece
43 . . . Lower contact piece
50 . . . Insulating member
60 . . . Ground terminal
60a . . . Main body
63 . . . Upper contact piece
64 . . . Inner contact piece
641 . . . Root portion
642 . . . Bent portion
643 . . . Contact portion
67 . . . Outer contact piece
671 . . . Root portion
672 . . . Bent portion
673 . . . Contact portion
70 . . . Housing
100 . . . Electronic component testing apparatus

What is claimed is:
1. A wiring board comprising:
a wiring board body; and
a coaxial connector mounted on the wiring board body, wherein
the coaxial connector comprises:
coaxial terminals arranged in a row; and
a housing that holds the coaxial terminals, each of the coaxial terminals comprises:
  a signal terminal; and
  a ground terminal that covers the signal terminal at intervals,
the ground terminal comprises:
  a tubular first main body;
  a first contact piece that extends from the first main body and includes a first contact portion that contacts the wiring board body; and
  a second contact piece that extends from the first main body and includes a second contact portion that contacts the wiring board body,
two of the coaxial terminals are a first coaxial terminal and a second coaxial terminal adjacent to the first coaxial terminal, and
in a transparent plan view seen through the wiring board along a normal direction of the wiring board body, a part of the first contact piece of the first coaxial terminal overlaps with a part of the second contact piece of the second coaxial terminal.

2. The wiring board according to claim 1, wherein
the first contact piece includes:
  the first contact portion disposed outside the first main body in the transparent plan view;
  a first root portion connected to the first main body; and
  a first bent portion interposed between the first contact portion and the first root portion and disposed inside the first main body in the transparent plan view,
the second contact piece includes:
  the second contact portion disposed inside the first main body in the transparent plan view;
  a second root portion connected to the first main body; and
  a second bent portion interposed between the second contact portion and the second root portion and disposed outside the first main body in the transparent plan view; and
in the transparent plan view, the first contact portion of the first coaxial terminal overlaps with the second bent portion of the second coaxial terminal.

3. The wiring board according to claim 1, wherein
the coaxial terminals are arranged in rows that are parallel to each other,
the coaxial terminals in mutually adjacent rows are arranged alternately,
the signal terminal comprises:
  a second main body; and
  a third contact piece that extends from the second main body and includes a third contact portion that contacts the wiring board body,
in the transparent plan view, the first contact portion of the first coaxial terminal is disposed on a first virtual straight line,
another of the coaxial terminals is a third coaxial terminal, and
the first virtual straight line passes through the third contact portion of the first coaxial terminal and the third contact portion of the third coaxial terminal in an adjacent row.

4. The wiring board according to claim 3, wherein
the third contact piece extends from the second main body in a first direction in the transparent plan view, and
the first direction is a direction parallel to an arrangement direction of the coaxial terminals included in the same row and is a direction from the second contact piece toward the first contact piece in the transparent plan view.

5. The wiring board according to claim 1, wherein
each of the coaxial terminals comprises a pair of second contact pieces including the second contact piece, and
in the transparent plan view, each of the pair of second contact pieces partially overlaps with the signal terminal.

6. The wiring board according to claim 1, wherein
the coaxial terminals are arranged in rows that are parallel to each other,
the coaxial terminals in adjacent rows are arranged alternately,
in the transparent plan view, a part of the signal terminal of the first coaxial terminal is disposed on a second virtual straight line,
another of the coaxial terminals is a third coaxial terminal, and
the second virtual straight line extends in a direction perpendicular to an arrangement direction of the coaxial terminals included in the same row and passes through the second contact portion of the third coaxial terminal in an adjacent row.

7. The wiring board according to claim 1, wherein
the coaxial terminals are arranged in rows that are parallel to each other,
the coaxial terminals in adjacent rows are arranged alternately,
in the transparent plan view, a part of the signal terminal of the first coaxial terminal is disposed on a third virtual straight line,
another of the coaxial terminals is a third coaxial terminal, and
the third virtual straight line extends in a direction perpendicular to an arrangement direction of the coaxial terminals included in the same row and passes through a part of the signal terminal of the third coaxial terminal in an adjacent row.

8. The wiring board according to claim 1, wherein
the ground terminal comprises a fourth contact piece that extends from an end of the first main body, and
the end is opposite to another end of the first main body from which the first and second contact pieces extend.

9. The wiring board according to claim 1, wherein
the signal terminal comprises:
  a second main body;
  a third contact piece that extends from the second main body and includes a third contact portion that contacts the wiring board body; and
  a fifth contact piece that extends from an end of the second main body, wherein the end is opposite to another end of the second main body from which the third contact piece extends.

10. The wiring board according to claim 1, wherein
each of the coaxial terminals comprises:
  a pair of the first contact pieces; and
  a pair of the second contact pieces,
in the transparent plan view, the pair of first contact pieces are arranged in line symmetry with respect to a centerline of each of the coaxial terminals,
the centerline extends along a direction parallel to an arrangement direction of the coaxial terminals included in the same row, and
in the transparent plan view, the pair of second contact pieces are arranged in line symmetry with respect to the centerline.

11. The wiring board according to claim 1, wherein each of the coaxial terminals comprises an insulator interposed between the signal terminal and the ground terminal.

12. The wiring board according to claim 1, wherein the wiring board body comprises:
   a first wiring pattern that contacts the first and second contact portions of the ground terminal; and
   a second wiring pattern that contacts the third contact portion of the signal terminal.

13. An electronic component testing apparatus that tests a DUT, the apparatus comprising:
   a wiring board according to claim 1.

14. A coaxial connector comprising:
   coaxial terminals; and
   a housing that holds the coaxial terminal, wherein
   the coaxial terminals are arranged in a row,
   each of the coaxial terminals comprises:
      a signal terminal; and
      a ground terminal that covers the signal terminal at intervals,
   the ground terminal comprises:
      a tubular first main body;
      a first contact piece that extends from the first main body and includes a first contact portion at a tip of the first contact piece; and
      a second contact piece that extends from the first main body and includes a second contact portion at a tip of the second contact piece,
   two of the coaxial terminals are a first coaxial terminal and a second coaxial terminal adjacent to the first coaxial terminal, and
   in a state where the coaxial connector is mounted on a wiring board body to assemble a wiring board, a part of the first contact piece of the first coaxial terminal overlaps with a part of the second contact piece of the second coaxial terminal in a transmission plan view seen through the wiring board along a normal direction of the wiring board body.

* * * * *